United States Patent
Kawashima

(10) Patent No.: US 10,910,416 B2
(45) Date of Patent: Feb. 2, 2021

(54) SEMICONDUCTOR DEVICE, IMAGE PICKUP DEVICE, AND METHOD FOR MANUFACTURING SEMICONDUCTOR DEVICE

(71) Applicant: SONY SEMICONDUCTOR SOLUTIONS CORPORATION, Kanagawa (JP)

(72) Inventor: Hiroyuki Kawashima, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/324,183

(22) PCT Filed: Jun. 7, 2017

(86) PCT No.: PCT/JP2017/021173
§ 371 (c)(1),
(2) Date: Feb. 8, 2019

(87) PCT Pub. No.: WO2018/037667
PCT Pub. Date: Mar. 1, 2018

(65) Prior Publication Data
US 2019/0181168 A1  Jun. 13, 2019

(30) Foreign Application Priority Data

Aug. 25, 2016  (JP) .................. 2016-164878

(51) Int. Cl.
*H01L 21/768* (2006.01)
*H01L 27/146* (2006.01)
(Continued)

(52) U.S. Cl.
CPC .... *H01L 27/14601* (2013.01); *H01L 21/7682* (2013.01); *H01L 21/76805* (2013.01);
(Continued)

(58) Field of Classification Search
CPC ......... H01L 27/14636; H01L 27/14601; H01L 21/7682; H01L 21/76831; H01L 23/5222; H01L 23/53295; H01L 23/5226
See application file for complete search history.

(56) References Cited

U.S. PATENT DOCUMENTS 5,798,559 A * 8/1998 Bothra ................ H01L 21/7682
257/508
6,218,282 B1 * 4/2001 Buynoski ............ H01L 21/7682
257/410

(Continued)

FOREIGN PATENT DOCUMENTS

JP   H05-021617   1/1993
JP   2002-353303  12/2002
(Continued)

OTHER PUBLICATIONS

Extended European Search Report for European Patent Application No. 17843155.7, dated Jul. 26, 2019, 8 pages.
(Continued)

*Primary Examiner* — Errol V Fernandes
*Assistant Examiner* — Jeremy J Joy
(74) *Attorney, Agent, or Firm* — Sheridan Ross P.C.

(57) ABSTRACT

To provide a semiconductor device, an image pickup device, and a method for manufacturing the semiconductor device that reduce wiring capacity by using gaps and maintain mechanical strength and reliability. A semiconductor device including: a multilayered wiring layer in which insulating layers and diffusion preventing layers are alternately laminated and a wiring layer is provided inside; a through-hole that is provided to penetrate through at least one or more insulating layers from one surface of the multilayered wiring layer and has an inside covered with a protective side wall;

(Continued)

and a gap that is provided in at least one or more insulating layers immediately below the through-hole.

20 Claims, 21 Drawing Sheets

(51) Int. Cl.
*H01L 23/522* (2006.01)
*H01L 23/532* (2006.01)

(52) U.S. Cl.
CPC .. *H01L 21/76816* (2013.01); *H01L 21/76831* (2013.01); *H01L 23/5222* (2013.01); *H01L 23/5226* (2013.01); *H01L 23/53295* (2013.01)

(56) References Cited

U.S. PATENT DOCUMENTS

| | | | |
|---|---|---|---|
| 6,245,658 B1* | 6/2001 | Buynoski | H01L 21/7682 257/E21.581 |
| 6,255,712 B1* | 7/2001 | Clevenger | H01L 21/764 257/276 |
| 6,413,852 B1* | 7/2002 | Grill | H01L 21/7682 257/E21.576 |
| 6,713,835 B1* | 3/2004 | Horak | H01L 21/7682 257/522 |
| 2001/0014526 A1* | 8/2001 | Clevenger | G06Q 40/04 438/619 |
| 2002/0145201 A1* | 10/2002 | Armbrust | H01L 21/7682 257/776 |
| 2003/0064577 A1* | 4/2003 | Hsu | H01L 21/76811 438/619 |
| 2003/0073302 A1* | 4/2003 | Huibers | B81C 99/0065 438/622 |
| 2003/0205817 A1* | 11/2003 | Romankiw | H01L 23/53238 257/758 |
| 2005/0127514 A1* | 6/2005 | Chen | H01L 21/7682 257/762 |
| 2005/0167841 A1* | 8/2005 | Papa Rao | H01L 23/5222 257/758 |
| 2007/0037380 A1* | 2/2007 | Torres | H01L 21/7682 438/619 |
| 2007/0102821 A1* | 5/2007 | Papa Rao | H01L 21/7682 257/758 |
| 2007/0259516 A1* | 11/2007 | Jahnes | H01L 21/76808 438/618 |
| 2008/0173976 A1* | 7/2008 | Stamper | H01L 23/5222 257/531 |
| 2008/0179750 A1* | 7/2008 | Arnal | H01L 23/5226 257/758 |
| 2009/0001510 A1* | 1/2009 | Matz | H01L 21/7682 257/531 |
| 2010/0055893 A1* | 3/2010 | Watanabe | H01L 21/76835 438/597 |
| 2010/0102455 A1* | 4/2010 | Yokoi | H01L 23/5222 257/774 |
| 2010/0308430 A1 | 12/2010 | Aoki | |
| 2011/0260326 A1 | 10/2011 | Clevenger et al. | |
| 2013/0122644 A1 | 5/2013 | Aoki | |
| 2013/0323930 A1 | 12/2013 | Chattopadhyay et al. | |
| 2016/0056067 A1* | 2/2016 | Endo | H01L 23/53295 257/776 |
| 2016/0118335 A1 | 4/2016 | Lee et al. | |
| 2016/0163749 A1 | 6/2016 | Yang et al. | |
| 2016/0204156 A1* | 7/2016 | Togashi | H04N 5/3745 257/292 |
| 2016/0211388 A1 | 7/2016 | Natsuaki et al. | |
| 2017/0345766 A1* | 11/2017 | Zhang | H01L 23/53252 |

FOREIGN PATENT DOCUMENTS

| | | |
|---|---|---|
| JP | 2002-353304 | 12/2002 |
| JP | 2006-019401 | 1/2006 |
| JP | 2010-062242 | 3/2010 |
| JP | 2010-283307 | 12/2010 |
| JP | 2011-233864 | 11/2011 |
| JP | 2013-084841 | 5/2013 |
| WO | WO 2015/025637 | 2/2015 |

OTHER PUBLICATIONS

International Search Report prepared by the Japan Patent Office dated Jun. 29, 2017, for International Application No. PCT/JP2017/021173.

* cited by examiner

SEMICONDUCTOR DEVICE, IMAGE PICKUP DEVICE, AND METHOD FOR MANUFACTURING SEMICONDUCTOR DEVICE

CROSS REFERENCE TO RELATED APPLICATIONS

This application is a national stage application under 35 U.S.C. 371 and claims the benefit of PCT Application No. PCT/JP2017/021173 having an international filing date of 7 Jun. 2017, which designated the United States, which PCT application claimed the benefit of Japanese Patent Application No. 2016-164878 filed 25 Aug. 2016, the entire disclosures of each of which are incorporated herein by reference.

TECHNICAL FIELD

The present invention relates to a semiconductor device, an image pickup device, and a method for manufacturing a semiconductor device.

BACKGROUND ART

In recent years, with the miniaturization of semiconductor devices, signal delay due to wiring has attracted attention as a factor reducing an operation speed of a semiconductor device. Specifically, since a sectional area of the wiring decreases due to the miniaturization of the semiconductor device, and a wiring resistance increases, delay in proportion to a product between the wiring resistance and wiring capacity (also referred to as RC delay) increases.

In order to reduce such signal delay due to wiring, causing an interlayer film between wirings to have a lower dielectric constant has been considered. However, an interlayer film material that realizes a sufficiently low dielectric constant has not been found yet.

Thus, further reducing the dielectric constant between wirings by removing the material between the wirings and providing a hollow layer (also referred to as an air gap) with a specific dielectric constant 1 between the wirings has been considered.

For example, Patent Literature 1 listed below discloses providing a structure that does not damage wirings when insulating layers between wirings are removed to form an air gap structure.

CITATION LIST

Patent Literature

Patent Literature 1: JP 2006-19401A

SUMMARY OF INVENTION

Technical Problem

However, since a thin film with low mechanical strength protrudes into a space in which the air gap is formed according to the technology disclosed in Patent Literature 1, there is a probability that the protruding thin film, may collapse. Also, since mechanical strength of an entire semiconductor device is degraded due to the air gap in a case in which intervals between the wirings are wide according to the technology disclosed in Patent Literature 1, there is a probability that reliability of the semiconductor device will be degraded.

Thus, the present disclosure proposes a novel and improved semiconductor device, an image pickup device, and a method for manufacturing the semiconductor device capable of reducing wiring capacity by using gaps and maintaining mechanical strength and reliability.

Solution to Problem

According to the present disclosure, there is provided a semiconductor device including: a multilayered wiring layer in which insulating layers and diffusion preventing layers are alternately laminated and a wiring layer is provided inside; a through-hole that is provided to penetrate through at least one or more insulating layers from one surface of the multilayered wiring layer and has an inside covered with a protective side wall; and a gap that is provided in at least one or more insulating layers immediately below the through-hole.

In addition, according to the present disclosure, there is provided an image pickup device including: a multilayered wiring layer in which insulating layers and diffusion preventing layers are alternately laminated and a wiring layer is provided inside; a through-hole that is provided to penetrate through at least one or more insulating layers from one surface of the multilayered wiring layer and has an inside covered with a protective side wall; and a gap that is provided in at least one or more insulating layers immediately below the through-hole.

In addition, according to the present disclosure, there is provided a method for manufacturing a semiconductor device, including: a step of forming a multilayered wiring layer in which insulating layers and diffusion preventing layers are alternately laminated and a wiring layer is provided inside; a step of forming a through-hole such that the through-hole penetrates through at least one or more insulating layers from one surface of the multilayered wiring layer; a step of forming a protective side wall inside the through-hole; and a step of forming a gap by etching at least one or more insulating layers immediately below the through-hole.

According to the present disclosure, it is possible to form gaps in insulating layers that are the second and following layers from a surface of the multilayered wiring layer that forms a semiconductor device. According to this, since it is possible to provide a hollow with a specific dielectric constant 1 between wirings while the mechanical strength of the semiconductor device is maintained, it is possible to reduce wiring capacity of the semiconductor device.

Advantageous Effects of Invention

According to the present disclosure, it is possible to reduce wiring capacity by the gaps and to maintain mechanical strength and reliability of the semiconductor device.

Note that the effects described above are not necessarily limitative. With or in the place of the above effects, there may be achieved any one of the effects described in this specification or other effects that may be grasped from this specification.

DESCRIPTION OF EMBODIMENTS

Figure 1:
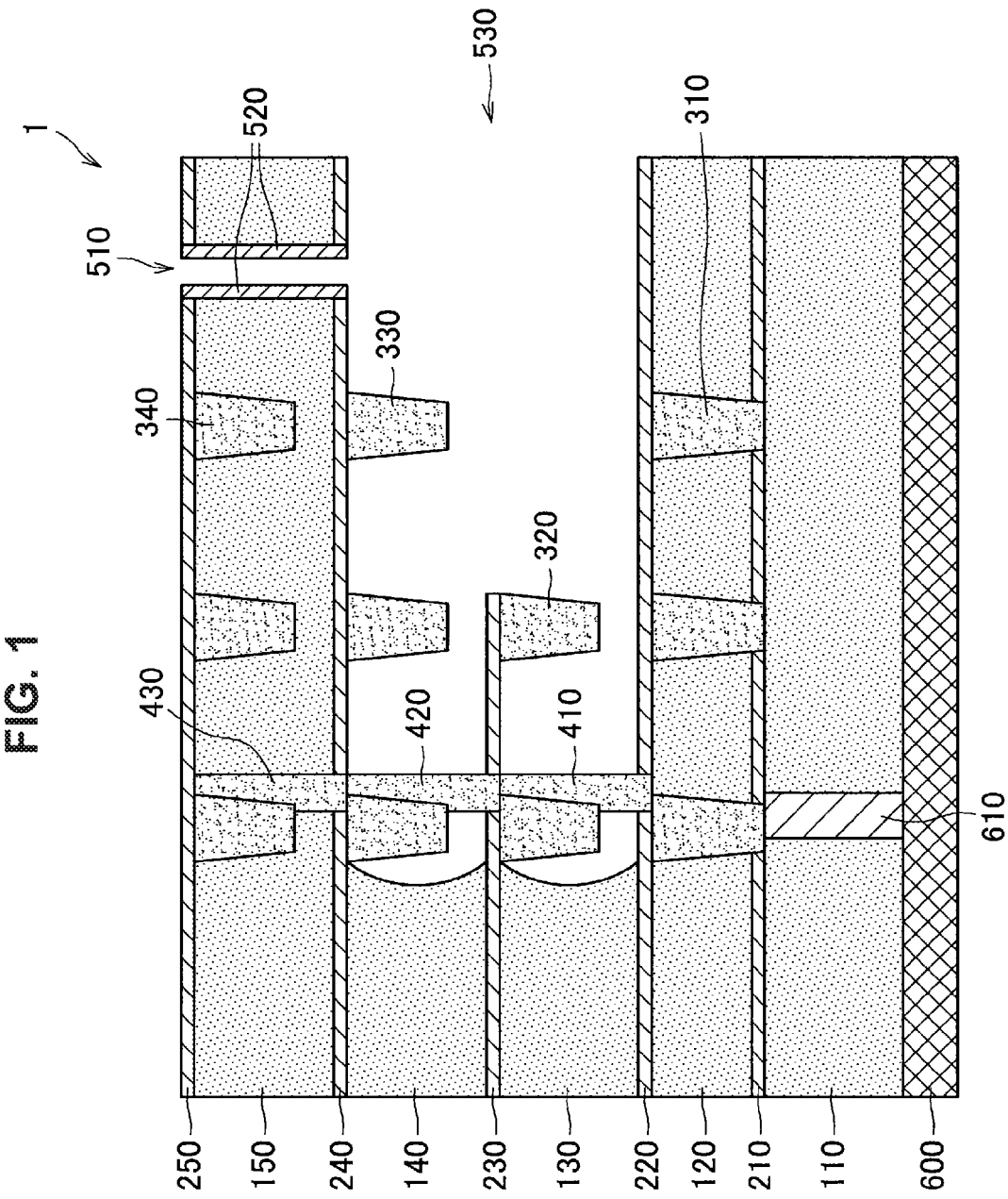
FIG. 1 is a sectional view of a semiconductor device according to a first embodiment of the present disclosure taken in a laminating direction.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be given in the following order.
1. First embodiment
1.1. Sectional structure of semiconductor device
1.2. Planar structure of semiconductor device
1.3. Method for manufacturing semiconductor device
1.4. Modification examples
2. Second embodiment
2.1. Sectional structure of semiconductor device
2.2. Method for manufacturing semiconductor device
3. Conclusion

1. First Embodiment

1.1. Sectional Structure of Semiconductor Device

First, a sectional structure of a semiconductor device according to a first embodiment of the present disclosure will be described with reference to FIG. 1. FIG. 1 is a sectional view of a semiconductor device 1 according to the embodiment taken in a laminating direction. Note that FIG. 1 illustrates a part of the sectional surface of the semiconductor device 1 according to the embodiment and it is needless to say that the semiconductor device 1 also extends in an in-plane direction in a range which is not illustrated in the drawing.

As illustrated in FIG. 1, the semiconductor device 1 includes a substrate 600 and a multilayered wiring layer in which first to fifth insulating layers 110, 120, 130, 140, and 150 and first to fifth diffusion preventing layers 210, 220, 230 240, and 250 are alternately laminated. In addition, the substrate 600 is provided with a semiconductor element (not illustrated), and the second to fifth insulating layers 120, 130, 140, and 150 are provided with first to fourth wiring layers 310, 320, 330, and 340, respectively. Note that the semiconductor element is caused to have continuity with the first wiring layer 310 via a contact plug 610, and the first to fourth wiring layers 310, 320, 330, and 340 are caused to have continuity with each other via first to third through-vias 410, 420, and 430.

In the following description, the first to fifth insulating layers 110, 120, 130, 140, and 150 will also be referred to collectively as insulating layers 100 while the first to fifth diffusion preventing layers 210, 220, 230, 240, and 250 will also be referred to collectively as diffusion preventing layers 200. Also, the first to fourth wiring layers 310, 320, 330, and 340 will also be referred to collectively as wiring layers 300 while the first to third through-vias 410, 420, and 430 will also be referred to collectively as through-vias 400.

That is, the semiconductor device 1 includes the multilayered wiring layer in which the insulating layers 100 including the wiring layers 300 and the through-vias 400 and the diffusion preventing layers 200 are alternately laminated.

Note that, although FIG. 1 illustrates that the semiconductor device 1 has a configuration of a five-layer structure in which the first to fifth insulating layers 110, 120, 130, 140, and 150 and the first to fifth diffusion preventing layers 210, 220, 230, 240, and 250 are alternately laminated, the technology according to the present disclosure is not limited to such an illustrative example. For example, the semiconductor device 1 may include a multilayered wiring layer including three or four layers or may include a multilayered wiring layer including six or more layers.

The insulating layers 100 are main layer formation materials that electrically insulate the wiring layers 300 from each other and form the semiconductor device 1. The insulating layers 100 include an insulating material that can be etched relatively easily (specifically, that can be etched more easily than the diffusion preventing layers 200, which will be described layer) and may include an insulating material such as $SiO_x$, for example.

The diffusion preventing layers 200 are provided to sandwich the respective insulating layers 100, suppress surface diffusion of metal atoms that form the wiring layers 300, and serve as stoppers when members in the upper layers are worked. Specifically, the diffusion preventing layers 200 include an insulating material with higher etching resistance (for example, etching resistance with respective to fluorine compounds) than the insulating layers 100 and may include an insulating material such as $SiN_x$, SiCN, SiON, or SiC, for example.

The wiring layers 300 deliver currents or voltages between the respective elements provided in the semiconductor device 1. The wiring layers 300 include a conductive metal material and may include copper (Cu), tungsten (W), aluminum (Al), or an alloy containing these metals, for example. Also, barrier metal layers may be formed using a metal with a high barrier property on the surfaces of the wiring layers 300, although these are not illustrated in the drawing. The barrier metal layer can include a metal such as tantalum (Ta), titanium (Ti), ruthenium (Ru), cobalt (Co), or manganese (Mn) or nitrides or oxides of these metals, for example.

The through-vias 400 electrically connect the wiring layers 300 provided in different insulating layers 100. Specifically, the first through-via 410 connects the first wiring layer 310 to the second wiring layer 320, the second through-via 420 connects the second wiring layer 320 to the third wiring layer 330, and the third through-via 430 connects the third wiring layer 330 to the fourth wiring layer 340. The through-vias 400 include a conductive metal material similarly to the wiring layers 300 and may include copper (Cu), tungsten (W), aluminum (Al), or an alloy containing these materials, for example. Also, barrier metal layers may be formed on the surfaces of the through-vias 400 similarly to the wiring layers 300.

The substrate 600 is a substrate including various semiconductors and may be a substrate including polycrystalline, monocrystalline, or amorphous silicon (Si). Also, the substrate 600 is provided with a semiconductor element that realizes functions of the semiconductor device 1. As the semiconductor element provided on the substrate 600, a logic circuit or the like including a memory element, a color sensor, or a transistor, for example, can be exemplified.

The contact plug 610 electrically connects an electrode or a wiring of the semiconductor element or the like provided on the substrate 600 to the first wiring layer 310. The contact plug 610 may include a metal material that is similar to that of the through-vias 400 and may include copper (Cu), tungsten (W), aluminum (Al), or an alloy containing these metals, for example.

In addition, the semiconductor device 1 is provided with a through-hole 510 that penetrates the fifth diffusion preventing layer 250, the fifth insulating layer 150, and the fourth diffusion preventing layer 240 and has an inside covered with a protective side wall 520, as illustrated in FIG. 1. The through-hole 510 causes a gap 530 provided at the third insulating layer 130 and the fourth insulating layer 140 to communicate with an external space.

Note that a sealing layer that blocks an opening of the through-hole 510 may be provided on the fifth diffusion preventing layer 250 although this is not illustrated in FIG. 1. The sealing layer includes an arbitrary insulating material such as $SiO_x$, $SiN_x$, SiCN, SiON, or SiC, for example and prevents moisture and the like from entering the through-hole 510 and the gap 530.

The through-hole 510 is provided to penetrate through the insulating layer 100 provided on any one surface of the semiconductor device 1 and the diffusion preventing layers 200 that sandwich the insulating layer 100. Specifically, the through-hole 510 is provided to penetrate through the fifth insulating layer 150, and the fourth diffusion preventing layer 240 and the fifth diffusion preventing layer 250 that sandwich the fifth insulating layer 150 therebetween. The shape of the opening of the through-hole 510 may be a substantially quadrangular shape with a side of at least 50 nm to 300 nm or may be a substantially circular shape with a diameter of 50 nm to 300 nm, for example.

The protective side wall 520 is provided inside the through-hole 510 to protect a side surface of the fifth insulating layer 150 exposed due to the through-hole 510. The protective side wall 520 includes an insulating material with higher etching resistance (for example, etching resistance with respect to fluorine compounds) than that of the insulating layers 100, for example, and may include an insulating material such as $SiN_x$, SiCN, SiON, SiOC, or SiC, for example.

The protective side wall 520 functions to protect the fifth insulating layer 150 such that the fifth insulating layer 150 is not etched when the gap 530 is formed. Specifically, the gap 530 is formed by introducing an etching solution via the through-hole 510 and performing wet-etching on the third insulating layer 130 and the fourth insulating layer 140. At this time, the protective side wall 520 prevents the fifth insulating layer 150 from being wet-etched by the etching solution. Therefore, it is possible to form the gap 530 in the insulating layer 100 provided inside the second and following layers in the multilayered wiring layer in the semiconductor device 1 by using the through-hole 510 with the inside covered with the protective side wall 520. Note that the protective side wall 520 may be a thin film of 5 nm to 30 nm, for example.

The gap 530 is provided in the second and following insulating layers 100 in the multilayered wiring layer (that is, the inside of the multilayered wiring layer) in the semiconductor device 1, and spaces in the wiring layers 300 are formed as hollows with a specific dielectric constant of 1. In this manner, the gap 530 can reduce wiring capacity in the wiring layers 300. Specifically, the gap 530 is provided at the third insulating layer 130 and the fourth insulating layer 140 and can reduce the wiring capacity by forming the space between the third wiring layer 330 and the second wiring layer 320 as a hollow.

Note that the gap 530 is not provided in the insulating layer 100 on the surface of the multilayered wiring layer in the semiconductor device 1. Specifically, the gap 530 is not provided in the first insulating layer 110 and the fifth insulating layer 150 on the surface of the multilayered wiring layer. In this manner, it is possible to maintain overall mechanical strength although the gap 530 is formed in the semiconductor device 1.

The gap 530 can be formed by introducing an etching solution via the through-hole 510 and performing etching on the third insulating layer 130 and the fourth insulating layer 140 by using a wet etching method.

At this time, a region in which the gap 530 is formed is restricted to a region surrounded by the diffusion preventing layers 200 in the laminating direction of the multilayered wiring layer. This is because it is difficult for etching to advance through the diffusion preventing layers 200 due to higher etching resistance thereof than that of the insulating layers 100. Therefore, in a case in which sufficient etching is performed, the gap 530 causes the second diffusion preventing layer 220 and the fourth diffusion preventing layer 240 that are present above and below the third insulating layer 130 and the fourth insulating layer 140 to be exposed.

In addition, the region in which the gap 530 is formed is controlled by a length of time during which etching is performed in the in-plane direction of the multilayered wiring layer. That is, the gap 530 is formed in a region that extends isotropically from a portion immediately below the through-hole 510 into which the etching solution has been introduced while the broadness of the region is controlled by an etching time.

Note that the through-vias 400 or the wiring layers 300 are not etched under conditions under which the insulating layers 100 are etched. Therefore, in a case in which the through-vias 400 or the wiring layers 300 are present in the region in which the gap 530 is formed, the through-vias 400 or the wiring layers 300 directly remain inside the gap 530. Also, in a case in which the insulating layers 100 are spatially sectioned by the through-vias 400 or the wiring layers 300, the etching solution does not enter a space on the opposite side sectioned by the through-vias 400 or the wiring layers 300. In this case, the region in which the gap 530 is formed is restricted by the through-vias 400 or the wiring layers 300.

In a case in which the gap 530 is provided in a plurality of insulating layers 100, a part of the diffusion preventing layers 200 between the plurality of insulating layers 100 is removed in advance to form an opening. Specifically, the gap 530 is provided in the third insulating layer 130 and the fourth insulating layer 140, and a part of the third diffusion preventing layer 230 in the vicinity of the through-hole 510 is removed in advance to form an opening. In this manner, since the etching solution can be diffused from the fourth insulating layer 140 to the third insulating layer 130 when the etching for forming the gap 530 is performed, it is possible to form the gap 530 over a plurality of layers, namely the third insulating layer 130 and the fourth insulating layer 140.

In addition, an opening is foil red at this time in the diffusion preventing layers 200 such that a region that protrudes to the gap 530 and is not formed above the wiring layer 300 is not formed. In this manner, it is possible to prevent the diffusion preventing layers 200 protruding to the gap 530 from collapsing after the gap 530 is formed.

Note that, although FIG. 1 illustrates a case in which only one through-hole 510 is formed, the technology according to the present disclosure is not limited to the aforementioned illustrative example. For example, a plurality of through-holes 510 may be formed. In such a case, the plurality of through-holes 510 may form the same gap 530 or each may form a separate gap 530.

Figure 2:
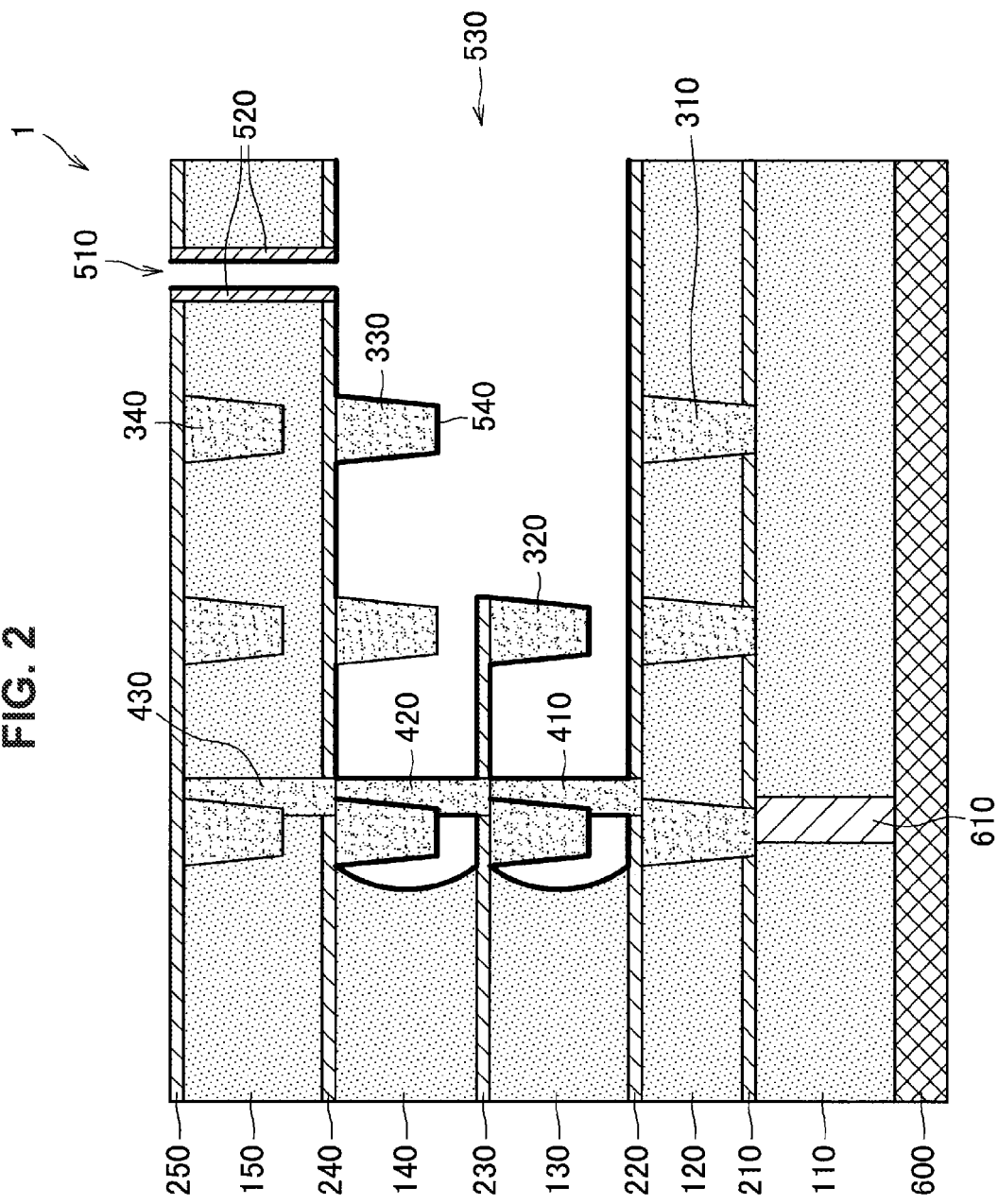
FIG. 2 is a sectional view illustrating a configuration in which a protective layer is formed in a surface inside a gap in the semiconductor device illustrated in FIG. 1.

In addition, the protective layer 540 may be formed on the surface exposed by the gap 530 as illustrated in FIG. 2. FIG. 2 is a sectional view illustrating a configuration in which the protective layer 540 is formed on the inner surface of the gap 530 in the semiconductor device 1 illustrated in FIG. 1.

As illustrated in FIG. 2, the protective layer 540 may be formed on each of the surfaces of the insulating layers 100, the diffusion preventing layers 200, the wiring layers 300, and the through-vias 400 exposed by the gap 530.

The protective layer 540 includes an arbitrary insulating material, for example, and may include an insulating material such as $SiO_x$, $SiN_x$, SiCN, SiON, SiOC, or SiC, for example. Also, the film thickness of the protective layer 540 may be 2 nm to 50 nm, for example. The protective layer 540 can improve reliability of the wirings by preventing electromigration and time dependant dielectric breakdown (TDDB) in the wiring layers 300 and the through-vias 400. Such a protective layer 540 can be formed by introducing a raw material gas into the gap 530 via the through-hole 510 and performing an atomic layer deposition (ALD) method, for example.

According to the semiconductor device 1 described above, it is possible to form a hollow between the wiring layers 300 by the gap 530 and thereby to reduce the wiring capacity. Therefore, it is possible to realize a high operation speed and low power consumption by suppressing delay in the wirings according to the semiconductor device 1.

In addition, since the gap 530 is not provided in the insulating layers 100 (that is, the first insulating layer 110 and the fifth insulating layer 150) provided on the surface of the multilayered wiring layer in the semiconductor device 1, it is possible to maintain mechanical strength of the entire semiconductor device 1. Further since the diffusion preventing layers 200 that protrude into the gap 530 are not generated in the semiconductor device 1, it is possible to prevent the diffusion preventing layers 200 with low mechanical strength from collapsing.

1.2. Planar Arrangement of Semiconductor Device

Figure 3:
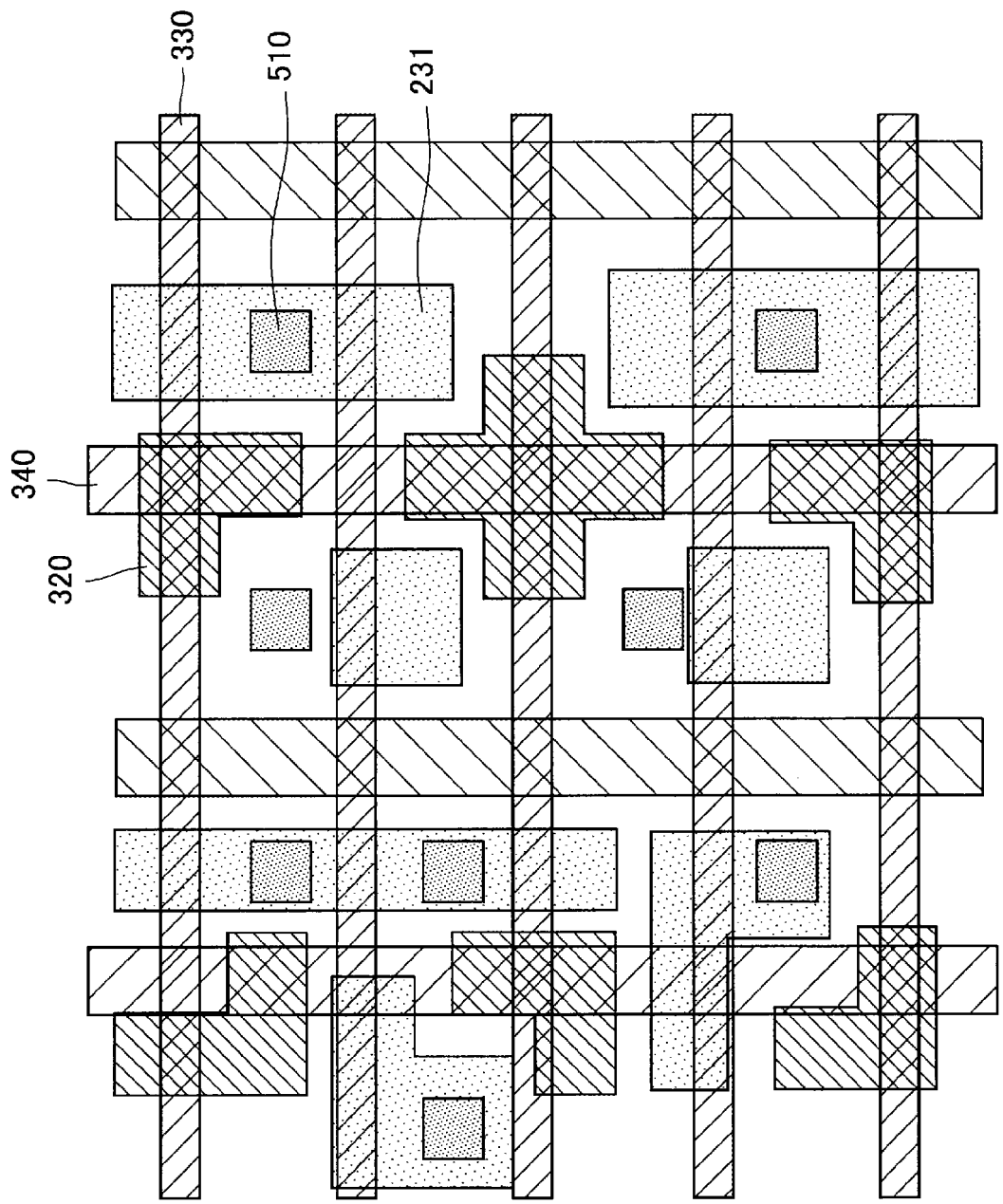
FIG. 3 is a planar diagram of the semiconductor device according to the embodiment in a plan view in the laminating direction.

Next, an example of planar arrangement of the respective configurations in the semiconductor device 1 according to the embodiment will be described with reference to FIG. 3. FIG. 3 is a planar diagram illustrating the semiconductor device 1 according to the embodiment in a plan view in the laminating direction.

Note that only the planar arrangement of the second to fourth wiring layers 320, 330, and 340, the through-hole 510, and an opening 231 formed in the third diffusion preventing layer 230 are illustrated and illustration of the other configurations is omitted. Also, the planar arrangement illustrated in FIG. 3 is just an example, and the planar arrangement of the respective configurations in the semiconductor device 1 according to the embodiment is not limited thereto.

Since the second to fourth wiring layers 320, 330, and 340 are formed in mutually different insulating layers 100 as illustrated in FIG. 3, partial regions thereof are formed in a mutually overlapped manner. Also, the first through-via 410 and the second through-via 420, for example, may be formed in the partial regions at which the second to fourth wiring layers 320, 330, and 340 mutually overlapping with each other.

The through-hole 510 is formed in a region in which the through-hole 510 does not overlap with the third wiring layer 330 and the fourth wiring layer 340 so as not to interfere with the third wiring layer 330 and the fourth wiring layer 340. The shape of the opening of the through-hole 510 may be a substantially quadrangular shape with a side of at least 50 nm to 300 nm, for example. Also, one through-hole 510 may be provided for one gap 530, or a plurality of through-holes 510 may be provided for one gap 530. Further, the through-hole 510 may be provided in a region for which it is desired to reduce wiring capacity.

The gap 530 is formed in a region in which the second to fourth wiring layers 320, 330, and 340 are not formed though not illustrated in the drawing.

The opening 231 formed in the third diffusion preventing layer 230 is formed in a region that avoids the region in which the second wiring layer 320 is formed. This is for preventing the second wiring layer 320 from collapsing by forming the opening 231 since the third diffusion preventing layer 230 is formed on the second wiring layer 320. In addition, the opening 231 may be formed in a region including a region in which the through-hole 510 is formed or may be formed in a region not including the region in which the through-hole 510 is formed. Note that the shape of the opening 231 formed in the third diffusion preventing layer 230 may be an arbitrary polygonal shape with a side of 50 nm to 500 nm.

1.3. Method for Manufacturing Semiconductor Device

Next, a method for manufacturing the semiconductor device 1 according to the embodiment will be described with reference to FIGS. 4 to 10. FIGS. 4 to 10 are sectional views illustrating steps of the method for manufacturing the semiconductor device 1 according to the embodiment.

Figure 4:
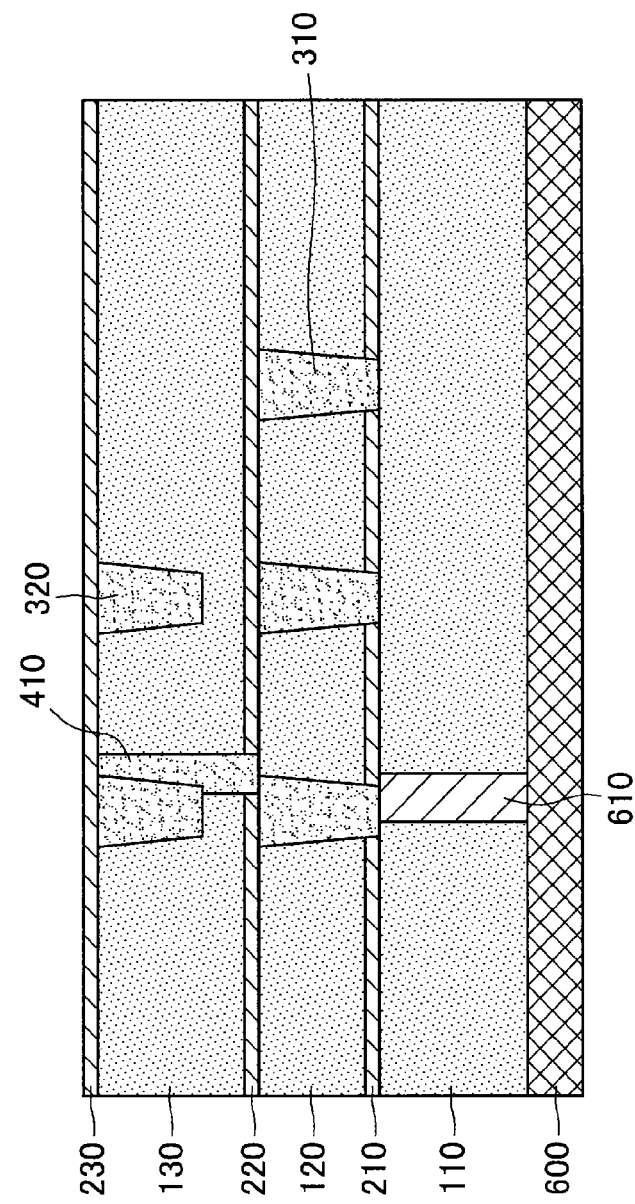
FIG. 4 is a sectional view illustrating a step of a method for manufacturing the semiconductor device according to the embodiment.

First, the first insulating layer 110, the first diffusion preventing layer 210, the second insulating layer 120, the second diffusion preventing layer 220, the third insulating layer 130, and the third diffusion preventing layer 230 are sequentially laminated on the substrate 600 provided with the semiconductor element and the like by a CVD method as illustrated in FIG. 4. In addition, the contact plug 610, the first wiring layer 310, the second wiring layer 320, and the first through-via 410 are formed in each of the insulating layers 100.

Specifically, the first insulating layer 110 is formed on the substrate 600 including silicon (Si) or the like, first. Next, the first wiring layer 310 can be formed by using a damascene method in which the first diffusion preventing layer 210 and the second insulating layer 120 are formed on the first insulating layer 110, the first diffusion preventing layer 210 and the second insulating layer 120 in a predetermined region are then removed by etching, and the etched portion is buried again with copper (Cu) or the like. In addition, the second wiring layer 320 and the first through-via 410 can be formed by a similar method.

Note that the first to third insulating layers 110, 120, and 130 may include $SiO_x$ or the like that can be easily etched with a hydrofluoric acid, and the first to third diffusion preventing layers 210, 220, and 230 may include SiC or the like with high etching resistance with respect to the hydrofluoric acid.

Figure 5:
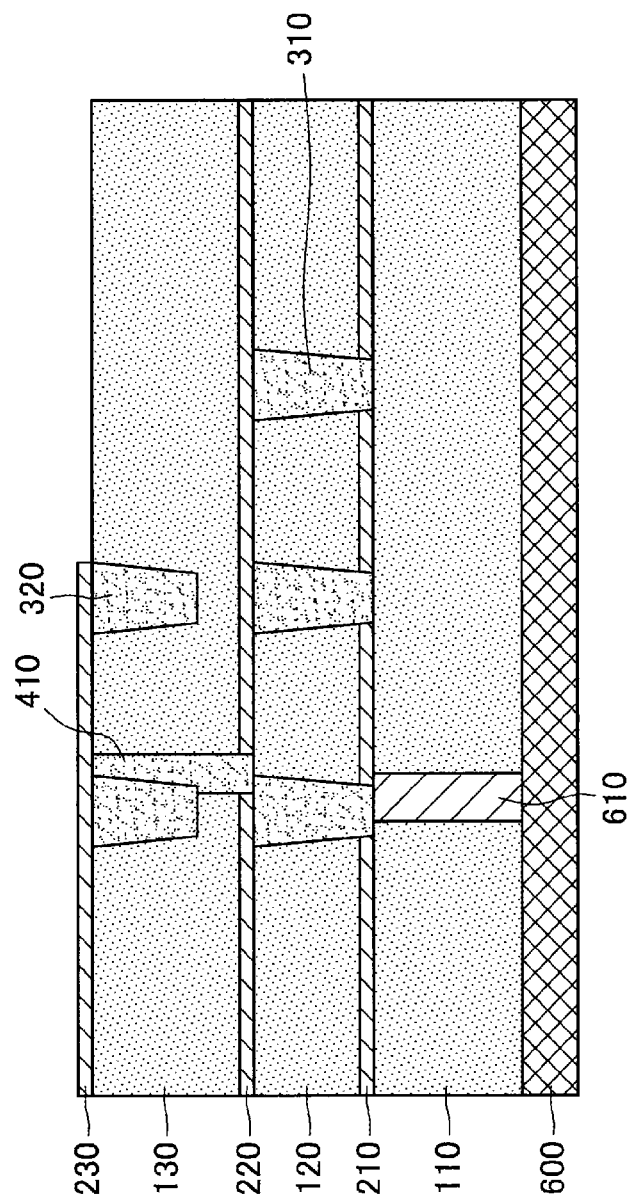
FIG. 5 is a sectional view illustrating a step of a method for manufacturing the semiconductor device according to the embodiment.

Next, a part of the third diffusion preventing layer 230 is removed by using a photolithography method as illustrated in FIG. 5. At this time, the region from which the third diffusion preventing layer 230 has been removed functions as an opening for introducing the etching solution into the second insulating layer 120 in a step of etching the second insulating layer 120 and the third insulating layer 130 in a later stage.

Figure 6:
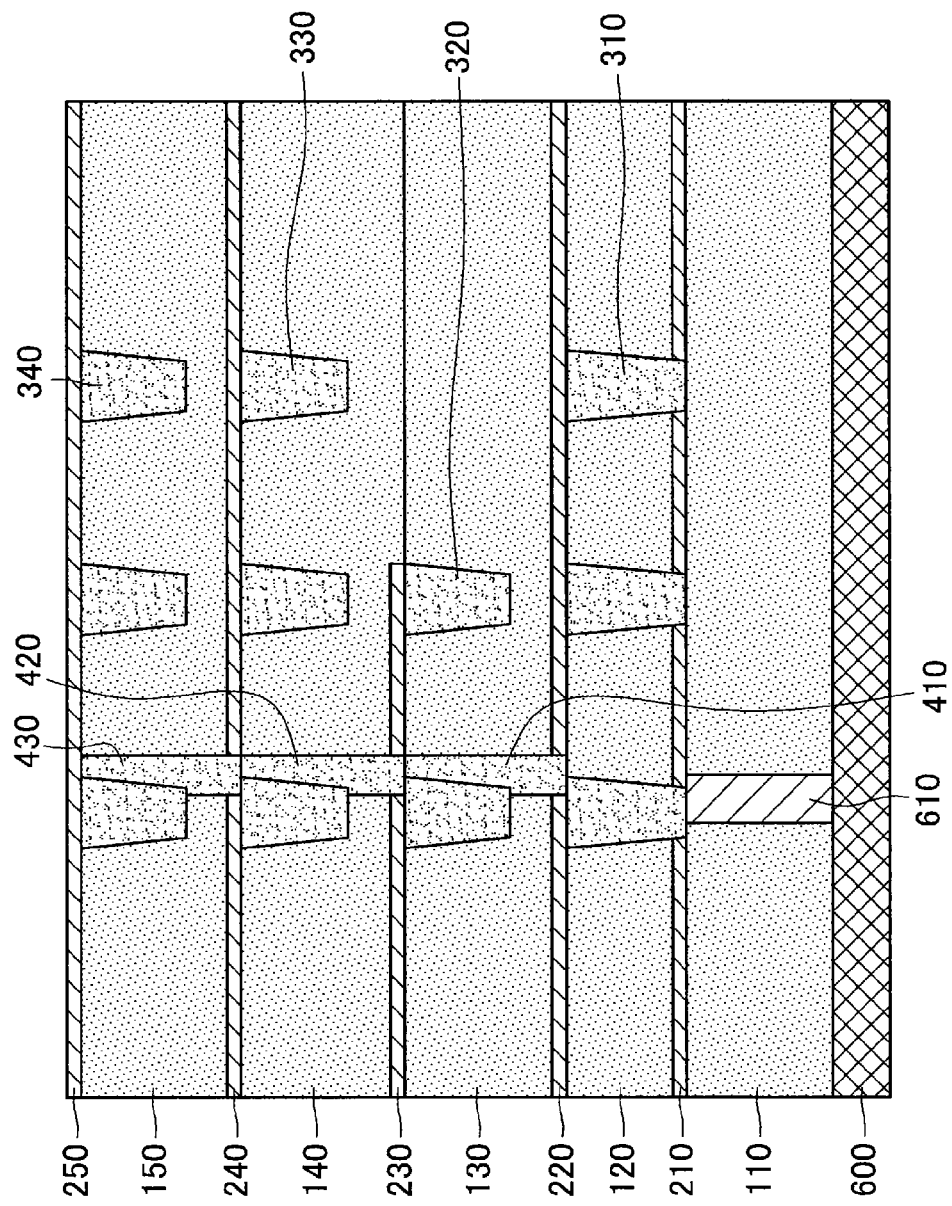
FIG. 6 is a sectional view illustrating a step of a method for manufacturing the semiconductor device according to the embodiment.

Next, the fourth insulating layer 140, the fourth diffusion preventing layer 240, the fifth insulating layer 150, and the fifth diffusion preventing layer 250 are sequentially laminated on the third diffusion preventing layer 230 by a CVD method as illustrated in FIG. 6. Also, the third wiring layer 330, the fourth wiring layer 340, the second through-via 420, and the third through-via 430 are formed on each of the insulating layers 100.

Specifically, it is possible to form the third wiring layer 330 by using the damascene method in which the fourth insulating layer 140 is formed on the third diffusion preventing layer 230, the fourth insulating layer 140 in a predetermined region is then removed by etching, and the etched portion is buried with copper (Cu) or the like. In addition, it is possible to form the fourth wiring layer 340, the second through-via 420, and the third through-via 430 by a similar method. Note that the fourth and fifth insulating layers 140 and 150 may include $SiO_x$ or the like that can be easily etched with a hydrofluoric acid, and the fourth and fifth diffusion preventing layers 240 and 250 may include SiC or the like with high etching resistance with respect to the hydrofluoric acid.

Figure 7:
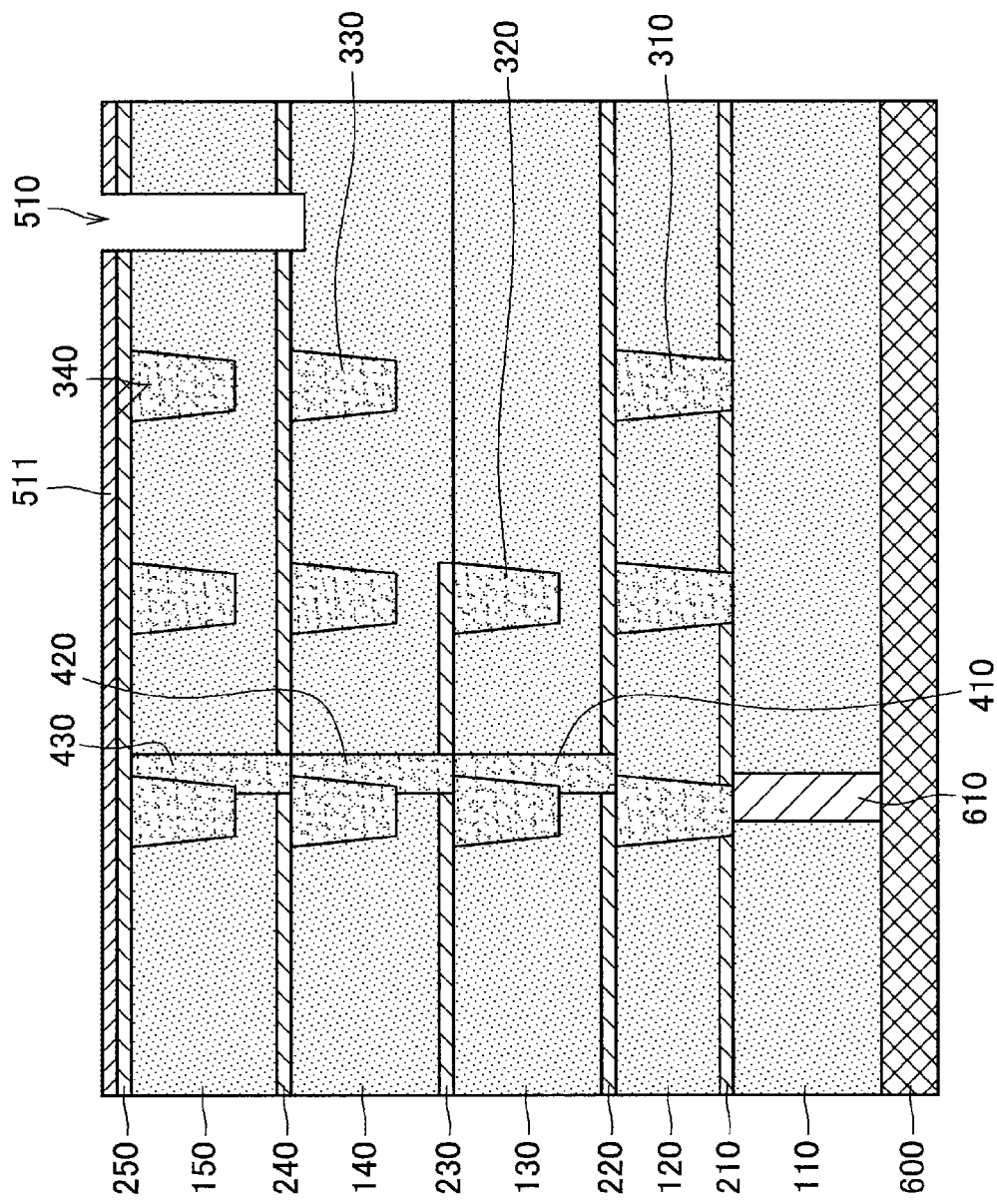
FIG. 7 is a sectional view illustrating a step of a method for manufacturing the semiconductor device according to the embodiment.

Next, the through-hole 510 is formed by forming a barrier layer 511 on the fifth diffusion preventing layer 250 and removing the fifth insulating layer 150, the fourth diffusion preventing layer 240, and the fifth diffusion preventing layer 250 in a partial region by using etching or the like as illustrated in FIG. 7. The barrier layer 511 functions to protect the fifth diffusion preventing layer 250 and may include $SiO_2$ of about 100 mm, for example. Also, the region in which the through-hole 510 is formed is a region in which the third wiring layer 330 and the fourth wiring layer 340 are not formed, for example, and the shape of the opening of the through hole 510 may be a square shape of 50 nm to 300 nm. Note that a plurality of through-holes 510 may be provided.

Figure 8:
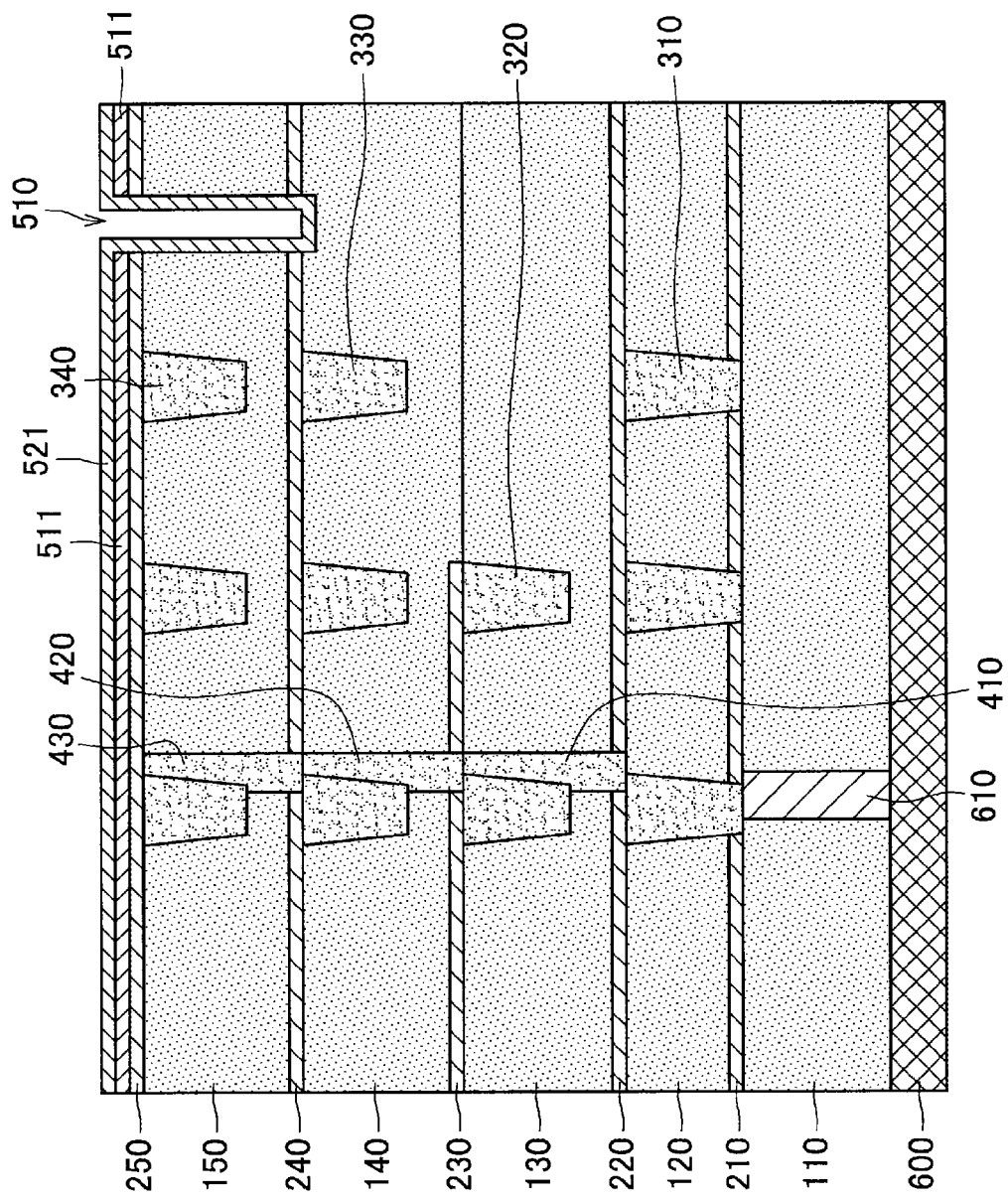
FIG. 8 is a sectional view illustrating a step of a method for manufacturing the semiconductor device according to the embodiment.

Next, a protective film 521 is formed on the barrier layer 511 and inside the through-hole 510 by using an ALD method as illustrated in FIG. 8. The protective film 521 may be formed to have a film thickness of 5 nm to 30 nm with SiC or the like with high etching resistance with respect to a hydrofluoric acid, for example. Here, since the protective film 521 is formed by using the ALD method, the protective film 521 is uniformly (conformally) formed on the barrier layer 511 and inside the through-hole 510.

Figure 9:
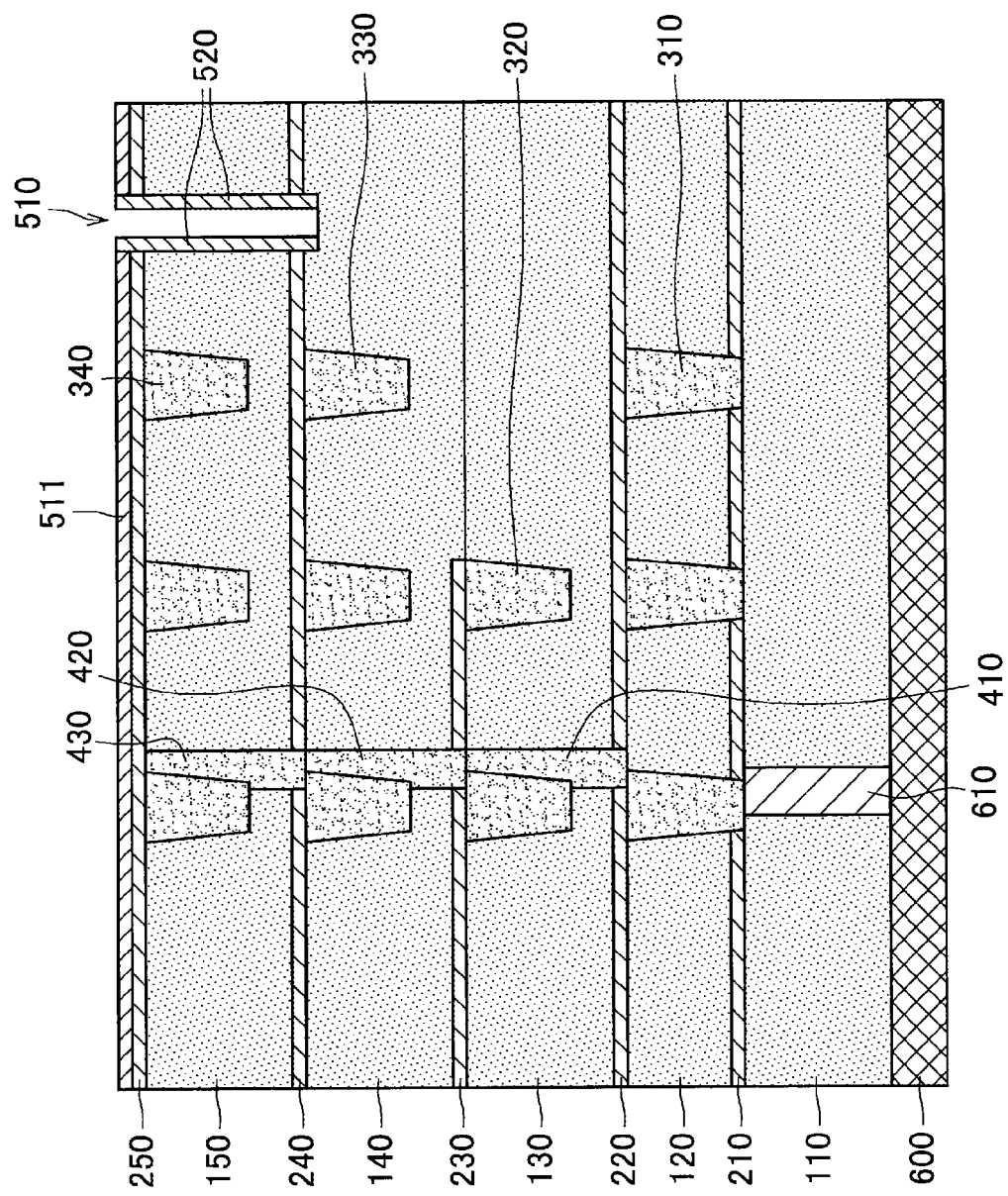
FIG. 9 is a sectional view illustrating a step of a method for manufacturing the semiconductor device according to the embodiment.

Next, the protective film 521 is removed while the protective side wall 520 is made to remain inside the through-hole 510 by etching back the entire surface of the protective film 521, thereby causing the barrier layer 511 and the fourth insulating layer 140 to be exposed as illustrated in FIG. 9. Such etching back of the entire surface can be realized by performing etching with significantly high perpendicular anisotropy. At this time, it is possible to prevent the fifth diffusion preventing layer 250 from being damaged by the etching back of the entire surface since the barrier layer 511 is provided on the fifth diffusion preventing layer 250.

Figure 10:
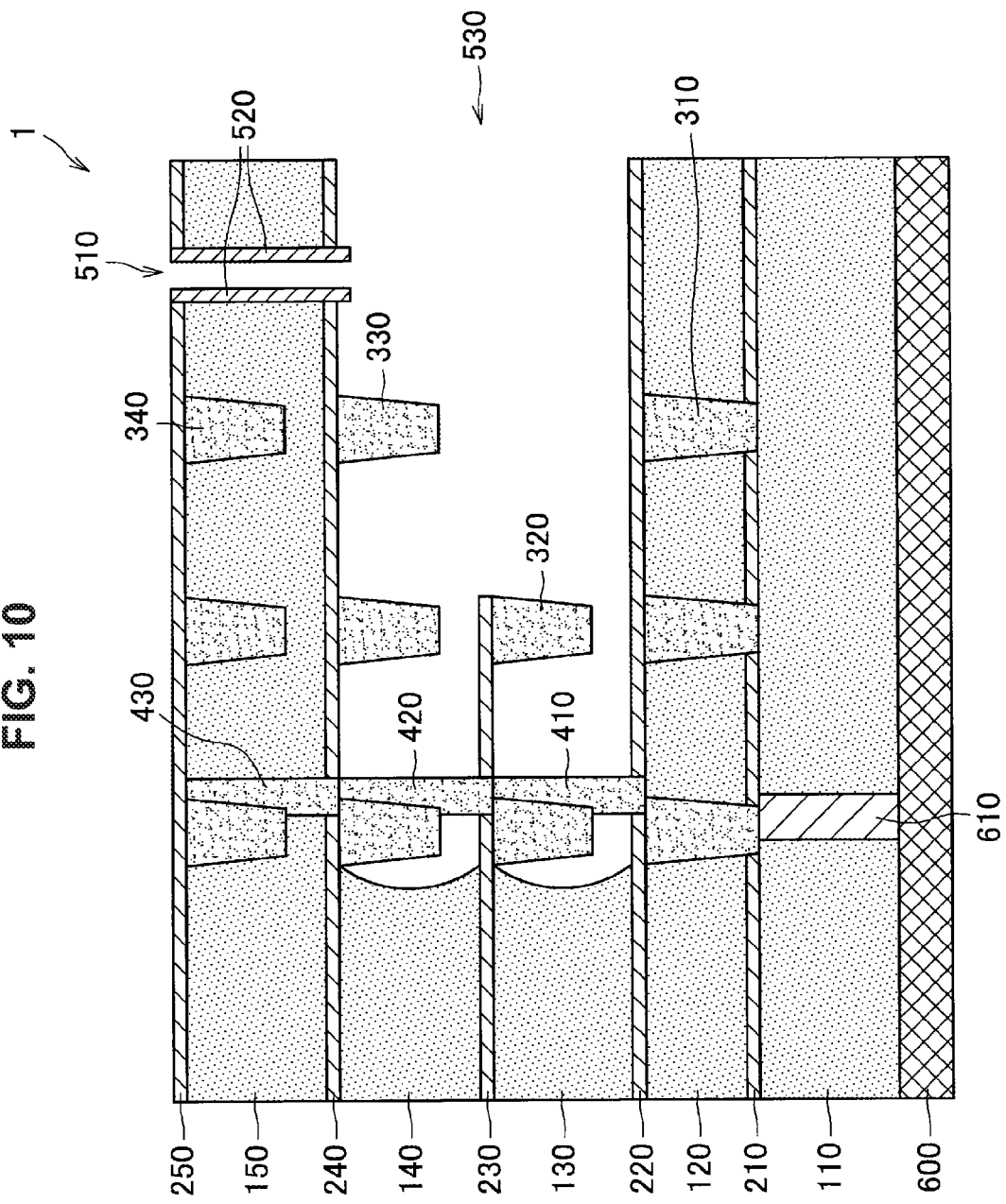
FIG. 10 is a sectional view illustrating a step of a method for manufacturing the semiconductor device according to the embodiment.

Next, the gap 530 is formed by introducing a diluted hydrofluoric acid into the second insulating layer 120 and the third insulating layer 130 via the through-hole 510 and performing wet-etching thereon as illustrated in FIG. 10. Note that the barrier layer 511 is removed by the wet etching using the diluted hydrofluoric acid at this time.

At this time, the etching hardly advances through the protective side wall 520 and the second to fourth diffusion preventing layers 220, 230, and 240 since the protective side wall 520 and the second to fourth diffusion preventing layers 220, 230, and 240 include SiC or the like with high etching resistance with respect to the hydrofluoric acid. Also, etching hardly advances through the second wring layer 320, the third wiring layer 330, the first through-via 410, and the second through-via 420 since the second wiring layer 320, the third wiring layer 330, the first through-via 410, and the second through-via 420 include a metal material such as copper (Cu) and have high etching resistance with respect to the hydrofluoric acid. Therefore, the region in which the gap 530 is formed is controlled depending on a region sandwiched between the second diffusion preventing layer 220 and the fourth diffusion preventing layer 240 in the laminating direction of the semiconductor device 1 and is controlled depending on a time during which the wet etching is performed in the in-plane direction of the semiconductor device 1.

In this manner, it is possible to etch only the second insulating layer 120 and the third insulating layer 130 by the wet etching using the diluted hydrofluoric acid and to thereby form the gap 530. Note that the third diffusion preventing layer 230 is formed in a region with an end corresponding to a region in which the second wiring layer 320 is formed and does not protrude to the gap 530, it is possible to prevent the third diffusion preventing layer 230 from collapsing.

It is possible to manufacture the semiconductor device 1 according to the embodiment through the aforementioned process. Note that a sealing layer that includes an insulating material and blocks the opening of the through-hole 510 may be provided on the fifth diffusion preventing layer 250 in order to prevent moisture and the like from entering the gap 530.

In the aforementioned manufacturing method, the hydrofluoric acid is used for the etching, $SiO_x$ is used as a material that can be easily etched with respect to the hydrofluoric acid for the insulating layers 100, and SiC is used as a material with high etching resistance with respect to the hydrofluoric acid for the diffusion preventing layers 200. However, the technology according to the present disclosure is not limited to the aforementioned illustrative example. An arbitrary combination may be employed as a combination of materials used for the insulating layers 100 and the diffusion preventing layers 200 as long as it is possible to secure a sufficient etching selection ratio. Also, it is possible to appropriately select the etching solution used for the etching in accordance with the insulating layers 100 and the diffusion preventing layers 200.

1.4. Modification Examples

Figure 11:
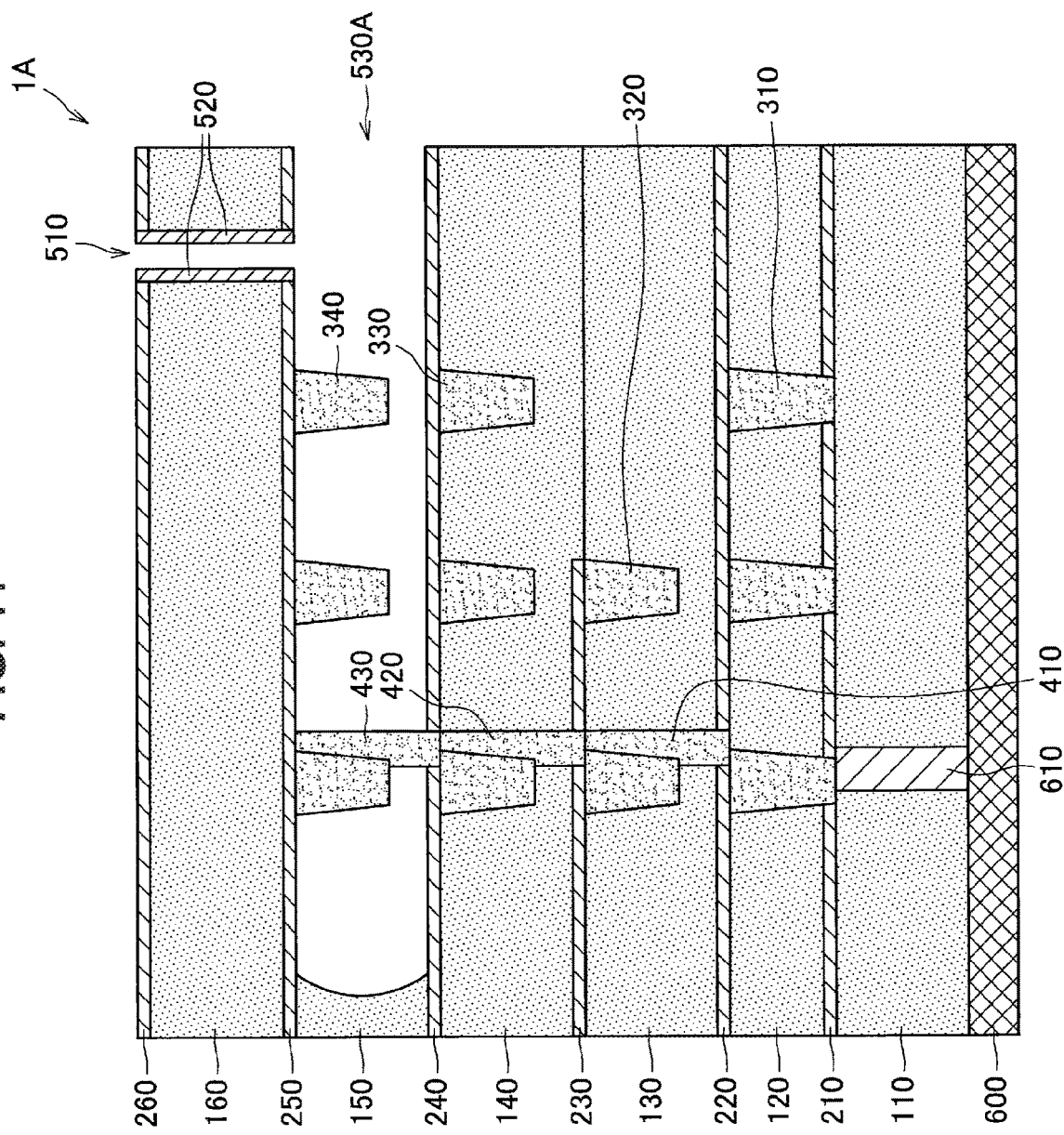
FIG. 11 is a sectional view illustrating a semiconductor device according to a first modification example taken in a laminating direction.
Figure 12:
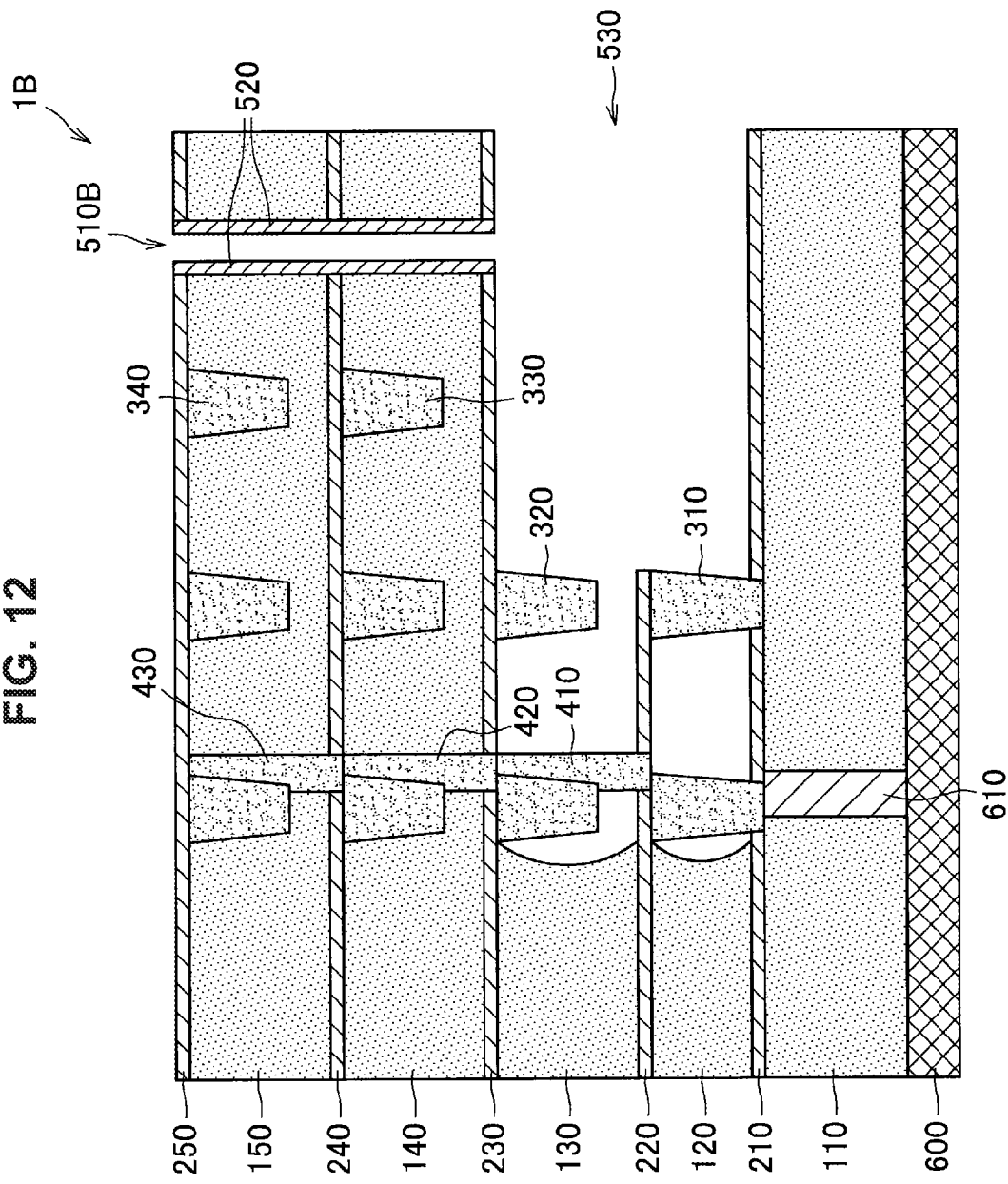
FIG. 12 is a sectional view illustrating a semiconductor device according to a second modification example taken in a laminating direction.
Figure 13:
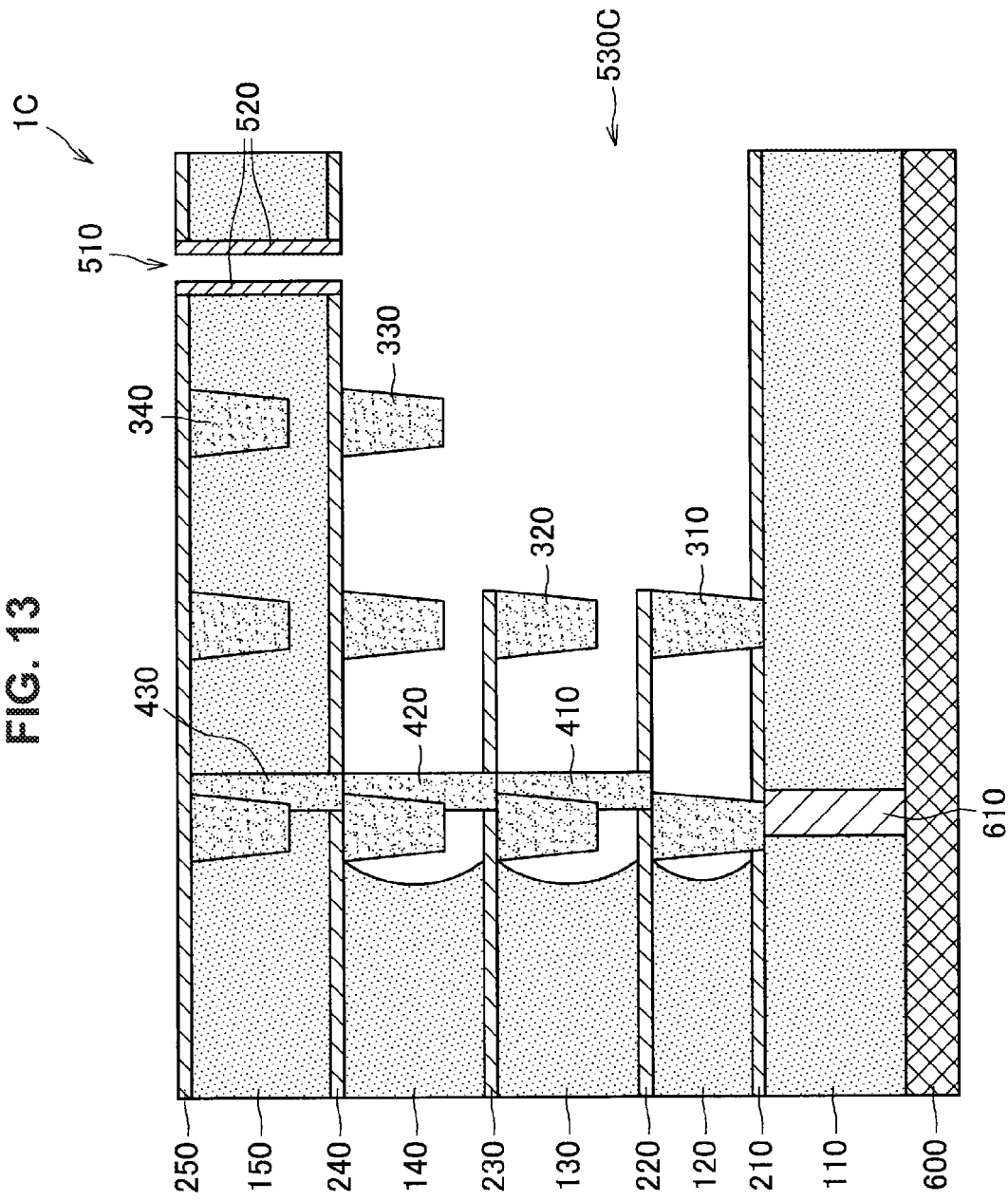
FIG. 13 is a sectional view illustrating a semiconductor device according to a third modification example taken in a laminating direction.

Here, modification examples of the semiconductor device 1 according to the embodiment will be described with reference to FIGS. 11 to 13. FIG. 11 is a sectional view illustrating a semiconductor device 1A according to a first modification example of the embodiment taken along the laminating direction, FIG. 12 is a sectional view illustrating a semiconductor device 1B according to a second modification example of the embodiment taken along the laminating direction, and FIG. 13 is a sectional view illustrating a semiconductor device 1C according to a third modification example of the embodiment taken along the laminating direction. Note that it is needless to say that FIGS. 11 to 13 illustrate parts of the sectional surfaces of the semiconductor devices and the semiconductor devices also extend in the in-plane direction in ranges that are not illustrated in the drawings.

First Modification Example

First, the semiconductor device 1A according to the first modification example of the embodiment will be described with reference to FIG. 11.

As illustrated in FIG. 11, the semiconductor device 1A includes a multilayered wiring layer in which six insulating layers 100 and six diffusion preventing layers 200 are alternately laminated and is different from the semiconductor device 1 as illustrated in FIG. 1 in that a gap 530A is formed in the fifth insulating layer 150. Here, a sixth insulating layer 160 may include a material similar to that of the first to fifth insulating layers 110, 120, 130, 140, and 150, and the sixth diffusion preventing layer 260 may include a material similar to that of the first to fifth diffusion preventing layers 210, 220, 230, 240, and 250. In addition, since the other configurations are as described above with reference to FIG. 1, the description thereof will be omitted here.

As illustrated in the semiconductor device 1A according to the first modification example, a gap 530A may be formed only in one insulating layer 100 (that is, the fifth insulating layer 150). At this time, since no opening is formed in the fourth diffusion preventing layer 240 provided below the fifth insulating layer 150 by etching, the etching solution does not enter the fourth insulating layer 140, and the gap 530A is not formed in the fourth insulating layer 140. In the semiconductor device 1A according to the first modification example, a space in which the gap 530A is formed is reduced, it is possible to improve mechanical strength of the entire semiconductor device 1A.

In addition, the semiconductor device 1A according to the first modification example may include a multilayered wiring layer in which six insulating layers 100 and six diffusion preventing layers 200 are alternately laminated or may include a multilayered wiring layer in which seven or more insulating layers 100 and seven or more diffusion preventing layers 200 are alternately laminated. In the technology according to the present technology, the number of layers laminated in the multilayered wiring layer that forms the semiconductor device 1 may be at least three or more in order to form the gap 530 inside the multilayered wiring layer, and an upper limit thereof is not particularly limited.

Second Modification Example

Next, a semiconductor device 1B according to a second modification example of the embodiment will be described with reference to FIG. 12.

As illustrated in FIG. 12 the semiconductor device 1B is different from the semiconductor device 1 as illustrated in FIG. 1 in that a through-hole 510E is formed to penetrate through the fourth and fifth insulating layers 140 and 150 and the third to fifth diffusion preventing layers 230, 240, and 250. Therefore, the gap 530 is formed in the second insulating layer 120 and the third insulating layer 130 in the semiconductor device 1B. Note that since the respective configurations in the semiconductor device 1B are as described above with reference to FIG. 1, description thereof will be omitted here.

As illustrated in the semiconductor device 1B according to the second modification example, the through-hole 501B may be provided to penetrate through the plurality of insulating layers 100 (that is, the fourth insulating layer 140 and the fifth insulating layer 150). At this time, since the opening is formed in the second diffusion preventing layer 220 and the etching solution for forming the gap 530 enters the second insulating layer 120 from the third insulating layer 130, the gap 530 is formed in the second insulating layer 120 and the third insulating layer 130. Since the gap 530 is formed in the third and following layers from the surface of the multilayered wiring layer in the semiconductor device 1B according to the second modification example, it is possible to improve mechanical strength of the entire semiconductor device 1B.

In addition, the through-hole 510B may be provided to further penetrate through three or more insulating layers 100 in the semiconductor device 1B according to the second modification example. However, since it becomes more difficult to form the through-hole 510B as an aspect ratio increases, the number of the insulating layers 100 through which the through-hole 510B penetrates may be four or less, for example.

Third Modification Example

Next, a semiconductor device 1C according to a third modification example of the embodiment will be described with reference to FIG. 13.

As illustrated in FIG. 13, the semiconductor device 1C is different from the semiconductor device 1 illustrated in FIG. 1 in that a gap 530C is formed in the second to fourth insulating layers 120, 130, and 140. Note that since the respective configurations in the semiconductor device 1C are as described above with reference to FIG. 1, description thereof will be omitted here.

As illustrated in the semiconductor device 1B according to the second modification example, the gap 530C may be further formed over the three or more insulating layers 100 other than the insulating layers 100 on the surface of the multilayered wiring layer (that is, the first insulating layer 110 and the fifth insulating layer 150) that forms the semiconductor device 1C. At this time, since an opening is formed in the second diffusion preventing layer 220 and the third diffusion preventing layer 230 by etching, the etching solution enters the second insulating layer 120 and the third insulating layer 130, and the gap 530C is formed from the second insulating layer 120 to the fourth insulating layer 140. In the semiconductor device 1C according to the third modification example, it is possible to form the gap 530C in more insulating layers 100, to thereby further suppress signal delay, and to further reduce power consumption by further reducing wiring capacity between the wirings.

In addition, the gap 530C may be further provided in a plurality of insulating layers 100 in the semiconductor device 1C according to the third modification example. However, since a probability that mechanical strength of the entire semiconductor device 1C is degraded increases as a space in which the gap 530C is formed increases, the number of the insulating layers 100 in which the gap 530C is formed may be 5 or less, for example.

2. Second Embodiment 2.1. Sectional Structure of Semiconductor Device

Figure 14:
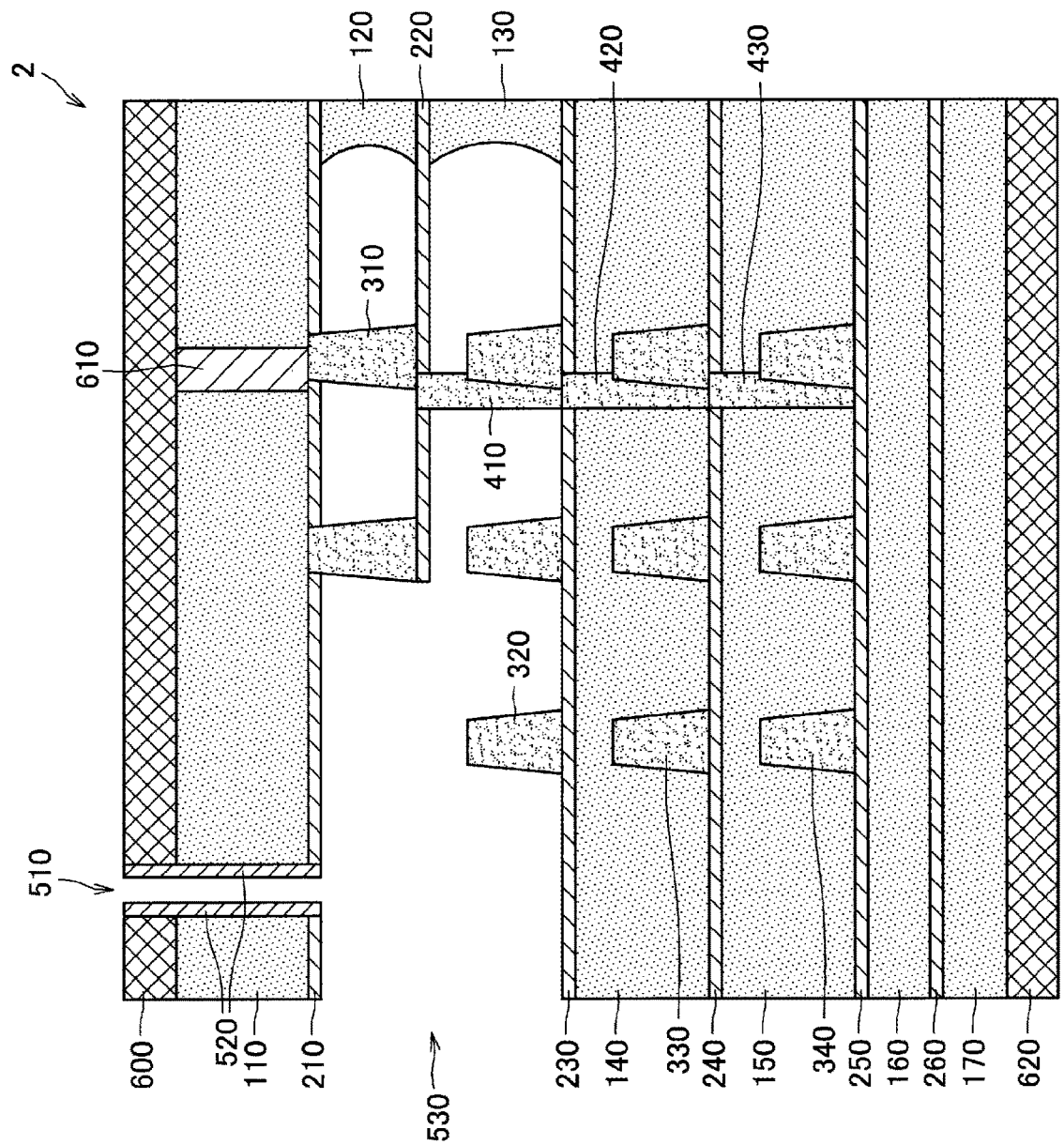
FIG. 14 is a sectional view illustrating a semiconductor device according to a second embodiment of the present disclosure taken in a laminating direction.

Next, a sectional structure of a semiconductor device according to a second embodiment of the present disclosure will be described with reference to FIG. 14. FIG. 14 is a sectional view of a semiconductor device 2 according to the embodiment taken in a laminating direction. Note that FIG. 14 illustrates a part of the sectional surface of the semiconductor device 2 and it is needless to say that the semiconductor device 2 also extends in an in-plane direction in a range which is not illustrated in the drawing.

As illustrated in FIG. 14, the multilayered wiring layer in which the insulating layers 100 and the diffusion preventing layers 200 are alternately laminated is sandwiched between a pair of substrates 600 and 620 in the semiconductor device 2, and the through-hole 510 is provided to penetrate through the substrate 600 and the first insulating layer 110. Note that the semiconductor device 2 illustrated in FIG. 14 is obtained by vertically inverting the semiconductor device 1 illustrated in FIG. 1.

Here, a sixth insulating layer 160 and a seventh insulating layer 170 may include a material similar to that of the first to fifth insulating layers 110, 120, 130, 140, and 150, and the sixth diffusion preventing layer 260 may include a material similar to that of the first to fifth diffusion preventing layers 210, 220, 230, 240, and 250. In addition, since the other configurations are as described above with reference to FIG. 1, the description thereof will be omitted here.

In the semiconductor device 2 according to the embodiment, it is possible to improve mechanical strength of the entire semiconductor device 2 by sandwiching the multilayered wiring layer in which the insulating layers 100 and the diffusion preventing layers 200 are alternately laminated between the pair of substrates 600 and 620.

A substrate of any material can be used as the substrate 620 as long as it is possible to bond the substrate 620 to the multilayered wiring layer in which the insulating layers 100 and the diffusion preventing layers 200 are alternately laminated. The substrate 620 may be a substrate including glass such as quartz, resin such as polyimide or polyester, or a semiconductor of silicone (Si) or the like, for example.

In addition, the thickness of the substrate 600 with the semiconductor element (not illustrated) formed thereon may be reduced by using chemical mechanical polishing (CMP) or the like. In a case in which the semiconductor element provided on the substrate 600 is a color sensor, such a semiconductor device 2 can be used as an image pickup device of a rear surface irradiation type, for example.

As illustrated in the semiconductor device 2 according to the embodiment, the through-hole 510 may be provided in the insulating layer 100 on any of the surfaces of the multilayered wiring layer in which the insulating layers 100 and the diffusion preventing layers 200 are alternately laminated. That is, the through-hole 510 may be provided in the first insulating layer 110 or may be provided in the seventh insulating layer 170. It is also possible to form the gap 530 inside the multilayered wiring layer via the through-hole 510 similarly to the first embodiment in the semiconductor device 2 in such a case.

2.2. Method for Manufacturing Semiconductor Device

Next, a method for manufacturing the semiconductor device 2 according to the embodiment will be described with reference to FIGS. 15 to 21. FIGS. 15 to 21 are sectional views illustrating steps of the method for manufacturing the semiconductor device 2 according to the embodiment.

Figure 15:
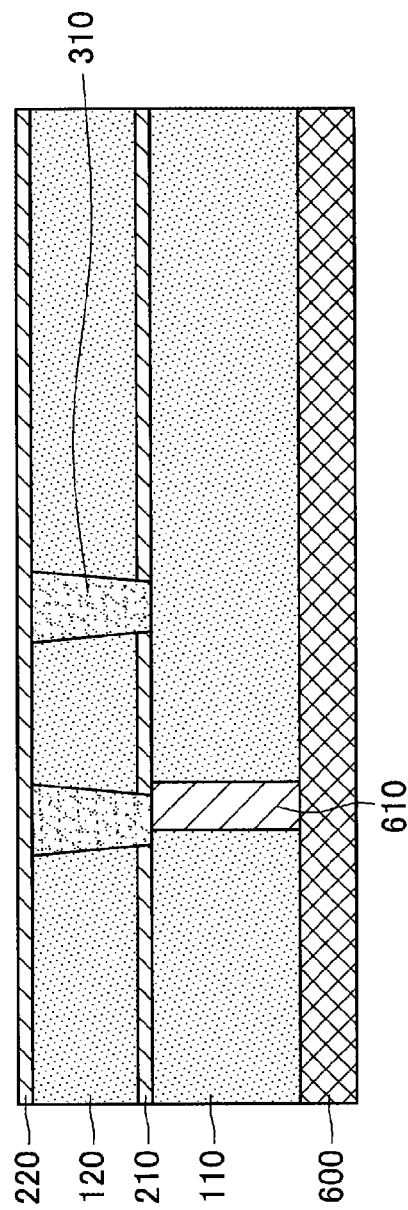
FIG. 15 is a sectional view illustrating a step of a method for manufacturing the semiconductor device according to the embodiment.

First, the first insulating layer 110, the first diffusion preventing layer 210, the second insulating layer 120, and the second diffusion preventing layer 220 are sequentially laminated on the substrate 600 with the semiconductor element and the like provided thereon by the CVD method as illustrated in FIG. 15. Also, the contact plug 610 is formed on the first insulating layer 110, and the first wiring layer 310 is formed on the second insulating layer 120.

Specifically the first insulating layer 110 is formed on the substrate 600 including silicon (Si) or the like, first. Next, the first wiring layer 310 can be formed by using a damascene method in which the first diffusion preventing layer 210 and the second insulating layer 120 are formed on the first insulating layer 110, the first diffusion preventing layer 210 and the second insulating layer 120 in a predetermined region are then removed by etching, and the etched portion is buried again with copper (Cu) or the like.

Note that the first and second insulating layers 110 and 120 may include $SiO_x$ or the like that can be easily etched with a hydrofluoric acid, and the first and second diffusion preventing layers 210 and 220 may include SiC or the like with high etching resistance with respect to the hydrofluoric acid.

Figure 16:
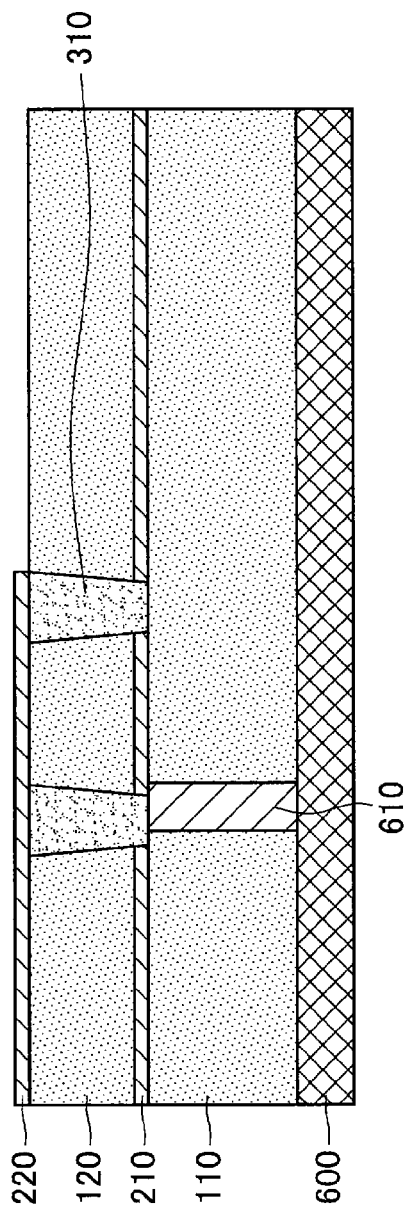
FIG. 16 is a sectional view illustrating a step of a method for manufacturing the semiconductor device according to the embodiment.

Next, a part of the second diffusion preventing layer 220 is removed by using a photolithography method as illustrated in FIG. 16. At this time, the region from which the second diffusion preventing layer 220 has been removed functions as an opening for introducing the etching solution into the third insulating layer 130 in a step of etching the second insulating layer 120 and the third insulating layer 130 in a later stage.

Figure 17:
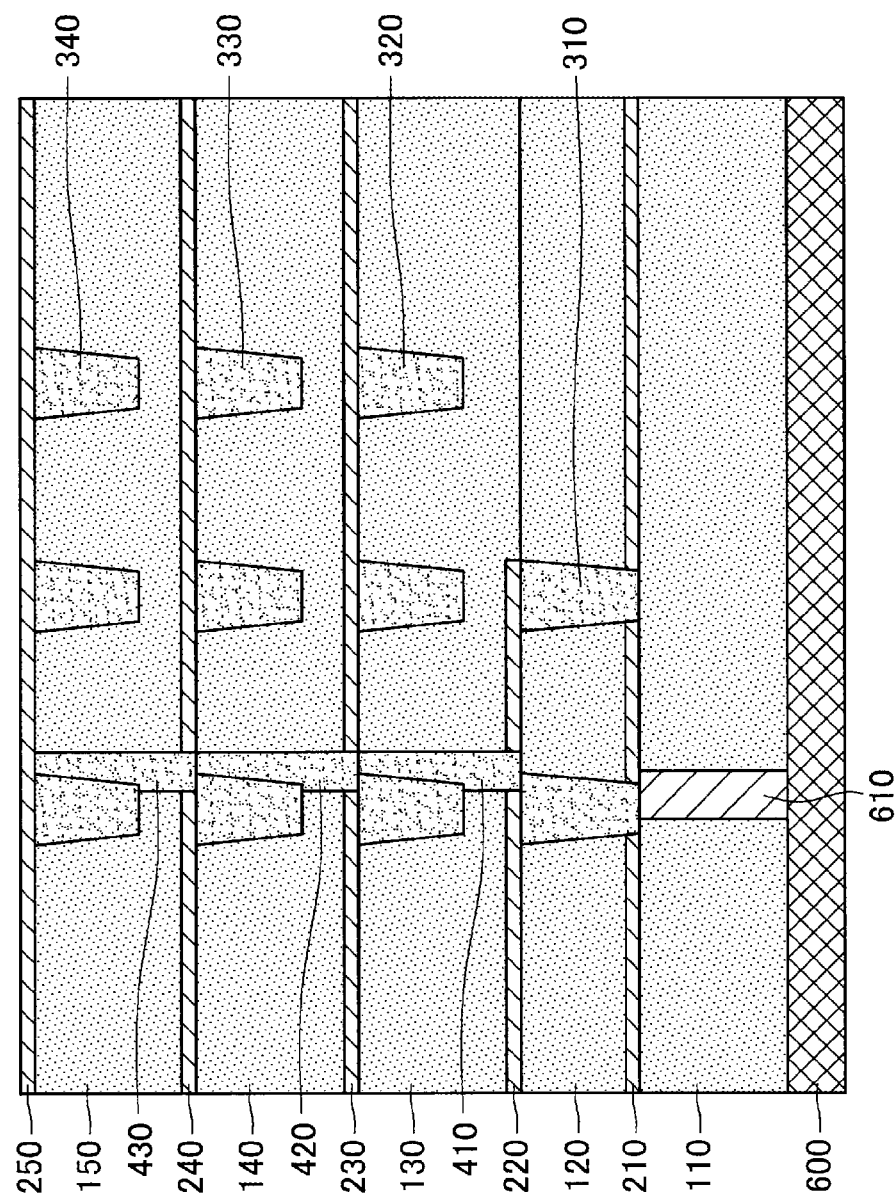
FIG. 17 is a sectional view illustrating a step of a method for manufacturing the semiconductor device according to the embodiment.

Next, the third insulating layer 130, the third diffusion preventing layer 230, the fourth insulating layer 140, the fourth diffusion preventing layer 240, the fifth insulating layer 150, and the fifth diffusion preventing layer 250 are sequentially laminated on the second diffusion preventing layer 220 by a CVD method as illustrated in FIG. 17. Also, the second wiring layer 320, the third wiring layer 330, the fourth wiring layer 340, the first through-via 410, the second through-via 420, and the third through-via 430 are formed on each of the insulating layers 100.

Specifically, it is possible to form the second wiring layer 320 by using the damascene method in which the third insulating layer 130 is formed on the second diffusion preventing layer 220, the third insulating layer 130 in a predetermined region is then removed by etching, and the etched portion is buried with copper (Cu) or the like. In addition, it is possible to form the third wiring layer 330, the fourth wiring layer 340, the first through-via 410, the second through-via 420, and the third through-via 430 by a similar method. Note that the third to fifth insulating layers 130, 140, and 150 may include SiOx or the like that can be easily etched with a hydrofluoric acid, and the third to fifth diffusion preventing layers 230, 240, and 250 may include SiC or the like with high etching resistance with respect to the hydrofluoric acid.

Figure 18:
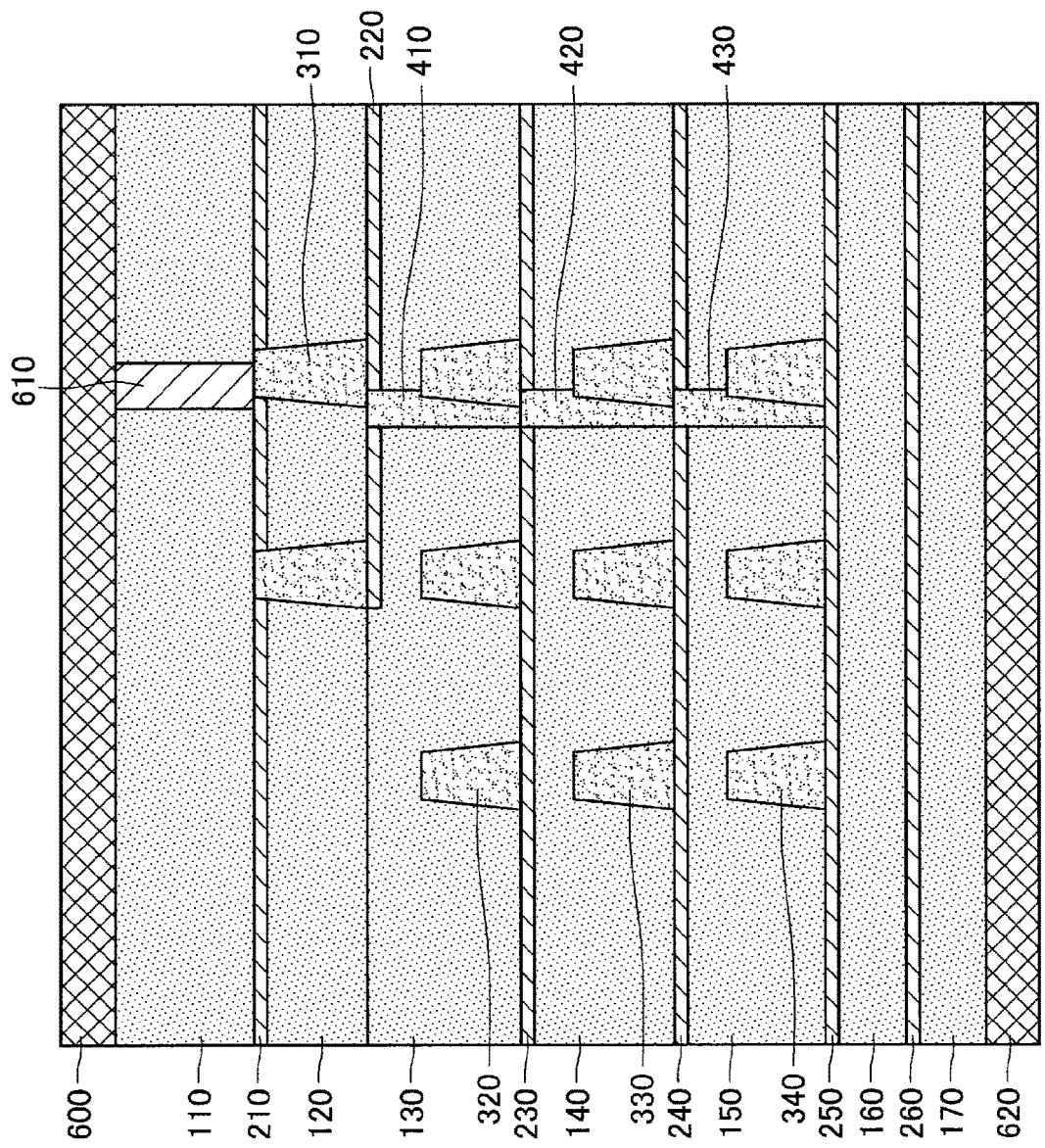
FIG. 18 is a sectional view illustrating a step of a method for manufacturing the semiconductor device according to the embodiment.

Next, the sixth insulating layer 160, the sixth diffusion preventing layer 260, and the seventh insulating layer 170 are laminated on the fifth diffusion preventing layer 250 by the CVD method, and the substrate 620 is then bonded to the surface of the seventh insulating layer 170 as illustrated in FIG. 18. In addition, the thickness of the substrate 600 may be reduced by CMP or the like after the substrate 620 is bonded to the multilayered wiring layer.

The sixth and seventh insulating layers 160 and 170 may include SiOx or the like that can be easily etched with a hydrofluoric acid, and the sixth diffusion preventing layer 260 may include SiC or the like with high etching resistance with respect to the hydrofluoric acid. Also, the substrate 620 may be a silicon (Si) substrate.

Figure 19:
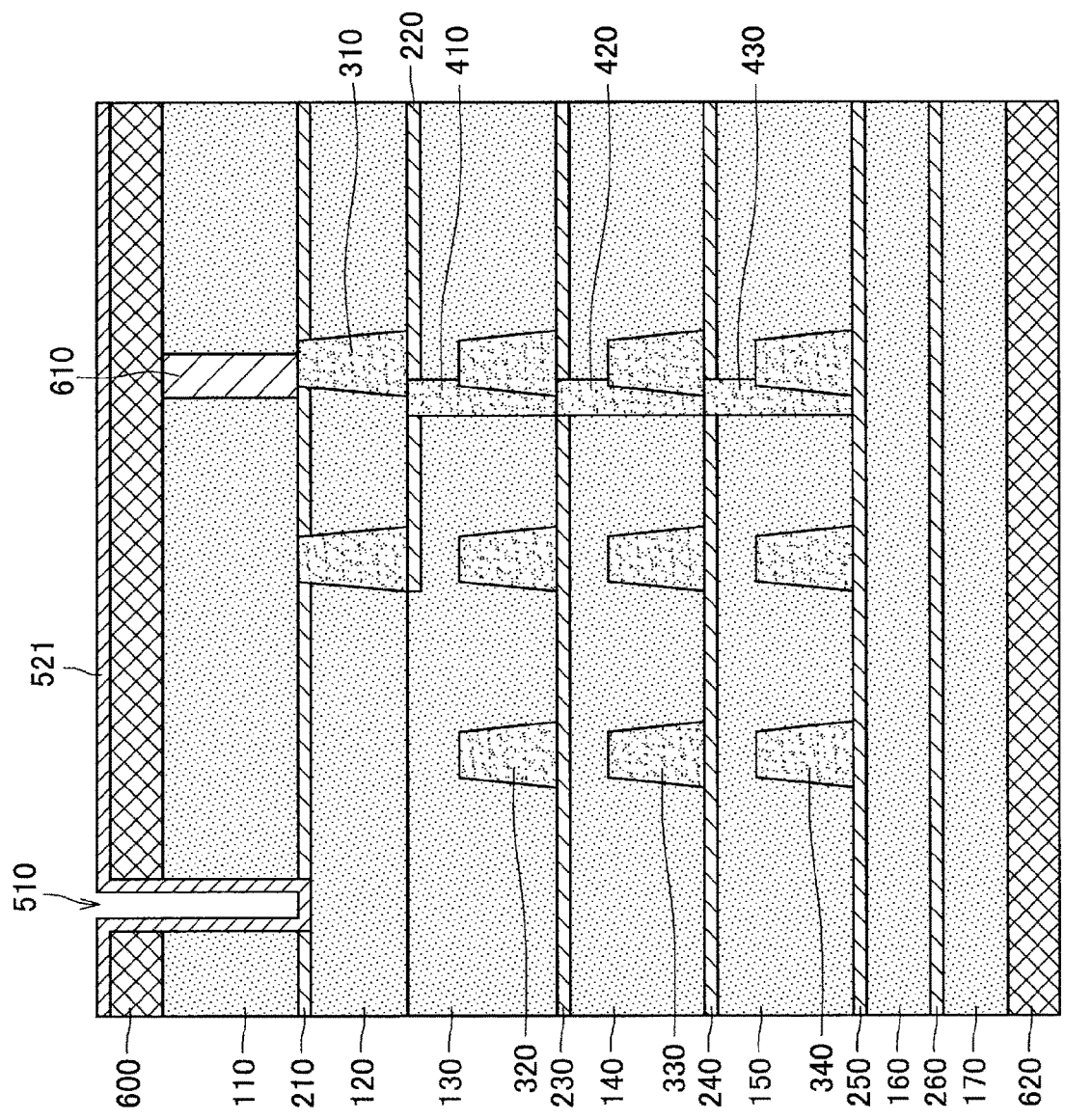
FIG. 19 is a sectional view illustrating a step of a method for manufacturing the semiconductor device according to the embodiment.

Next, the through-hole 510 may be formed by removing the first insulating layer 110, the first diffusion preventing layer 210, and the substrate 600 in a partial region by using etching or the like as illustrated in FIG. 19. In addition, the protective film 521 is formed on the substrate 600 and inside the through-hole 510. The shape of the opening of the through-hole 510 may be a square shape with a side of 50 nm to 300 nm, and a plurality of through-holes 510 may be provided. The protective film 521 may be formed to have a film thickness of 5 nm to 30 nm by using SiC or the like with high etching resistance with respect to the hydrofluoric acid, for example. Here, since the protective film 521 is formed by using the ALD method, the protective film 521 is uniformly (conformally) formed on the substrate 600 and inside the through-hole 510.

Figure 20:
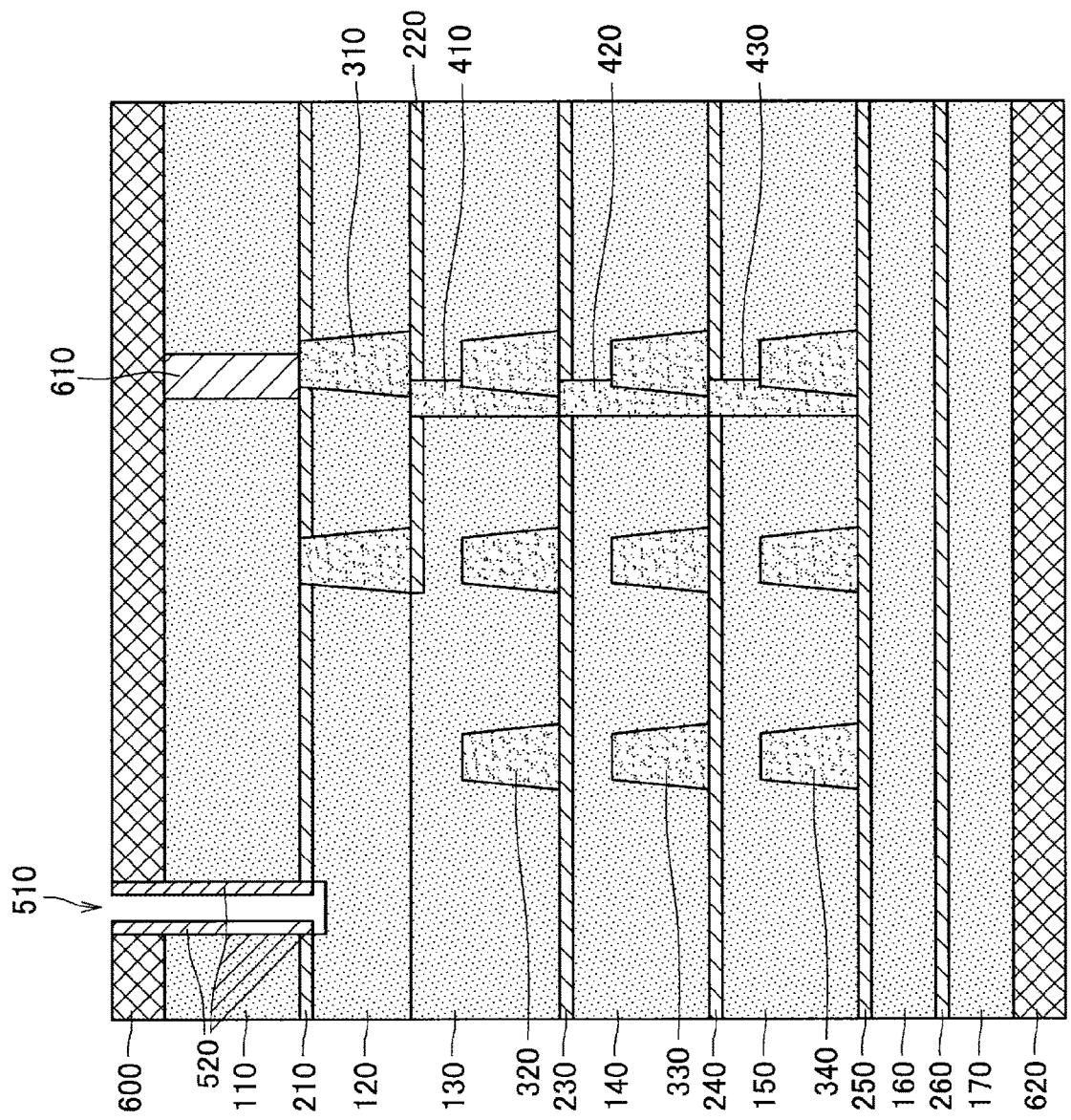
FIG. 20 is a sectional view illustrating a step of a method for manufacturing the semiconductor device according to the embodiment.

Next, the substrate 600 and the second insulating layer 120 are exposed by removing the protective film 521 while causing the protective side wall 520 to remain inside the through-hole 510 by etching back the entire surface of the protective film 521 as illustrated in FIG. 20. Such etching back of the entire surface can be realized by performing etching with high perpendicular anisotropy, for example.

Figure 21:
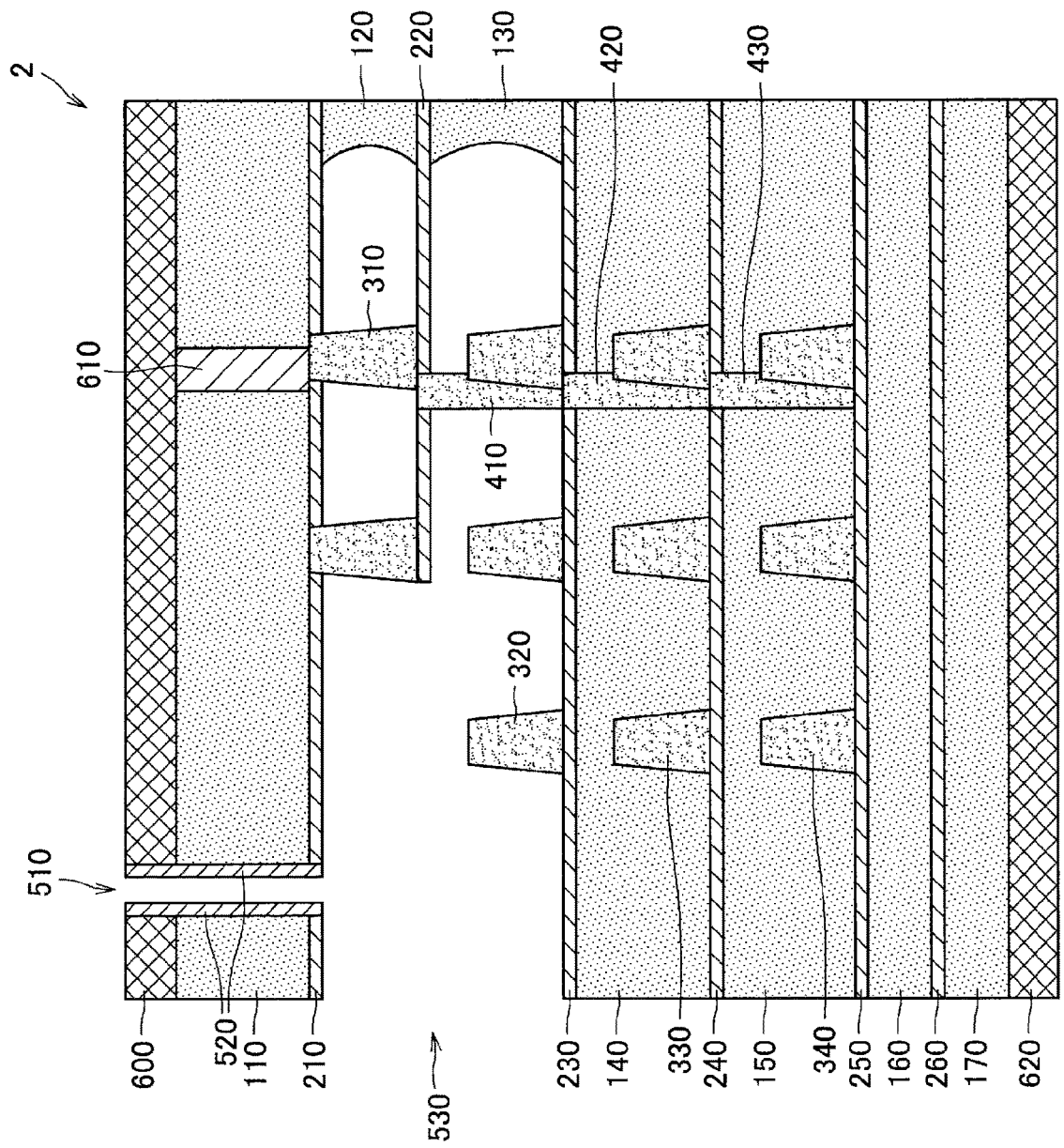
FIG. 21 is a sectional view illustrating a step of a method for manufacturing the semiconductor device according to the embodiment.

Next, the gap 530 is formed by introducing a diluted hydrofluoric acid into the second insulating layer 120 and the third insulating layer 130 via the through-hole 510 and performing wet watching as illustrated in FIG. 21.

At this time, the etching hardly advances through the protective side wall 520 and the first to third diffusion preventing layers 210, 220, and 230 since the protective side wall 520 and the first to third diffusion preventing layers 210, 220, and 230 include SiC or the like with high etching resistance with respect to the hydrofluoric acid. Also, etching hardly advances through the first wiring layer 310, the second wring layer 320, and the first through-via 410 since the first wiring layer 310, the second wiring layer 320, and the first through-via 410 include a metal material such as copper (Cu) and have high etching resistance with respect to the hydrofluoric acid. Therefore, the region in which the gap 530 is formed is controlled depending on a region sandwiched between the first diffusion preventing layer 210 and the third diffusion preventing layer 230 in the laminating direction of the semiconductor device 2 and is controlled depending on a time during which the wet etching is performed in the in-plane direction of the semiconductor device 2.

It is possible to manufacture the semiconductor device 2 according to the embodiment through the aforementioned process. Note that a sealing layer that includes an insulating material and blocks the opening of the through-hole 510 may be provided on the substrate 600 in order to prevent moisture and the like from entering the gap 530.

In the method for manufacturing the semiconductor device 2 according to the embodiment, the gap 530 is formed inside the semiconductor device 2 after the thickness of the substrate 600 is reduced by the CMP. According to this, it is possible to suppress occurrence of cracking or the like in the CMP process since the gap 530 is formed in the semiconductor device 2 after the CMP process in which mechanical stress is applied.

3. Conclusion

As described above, it is possible to provide a hollow between the wiring layers 300 by the gap 530 provided inside and to thereby reduce wiring capacity according to the semiconductor device of the embodiment of the present disclosure. In this manner, it is possible to suppress delay in the wirings and to thereby realizing a high operation speed and lower power consumption according to the semiconductor device.

In addition, since the gap 530 is not provided in the insulating layers 100 provided on the surface of the multilayered wiring layer in the semiconductor device, it is possible to maintain mechanical strength of the entire semiconductor device. Further since the diffusion preventing layers 200 that protrude into the gap 530 are not generated in the semiconductor device, it is possible to prevent the diffusion preventing layers 200 with low mechanical strength from collapsing.

According to the semiconductor device of the embodiment of the present disclosure, it is possible to use the semiconductor device in a memory device, a logic circuit, or an image pickup device, for example, by changing semiconductor elements to be mounted thereon. In particular, it is possible to use the semiconductor device 2 according to the second embodiment of the present disclosure as an image pickup device of a rear surface irradiation type by mounting a color sensor as a semiconductor element.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A semiconductor device including:

a multilayered wiring layer in which insulating layers and diffusion preventing layers are alternately laminated and a wiring layer is provided inside;

a through-hole that is provided to penetrate through at least one or more insulating layers from one surface of the multilayered wiring layer and has an inside covered with a protective side wall; and a gap that is provided in at least one or more insulating layers immediately below the through-hole.

(2)

The semiconductor device according to (1), in which at least a part of the wiring layer is provided inside the gap.

(3)

The semiconductor device according to (1) or (2), in which the gap is provided over a plurality of the insulating layers.

(4)

The semiconductor device according to (3), in which an opening is provided in a partial region in the diffusion preventing layer between the plurality of insulating layers provided with the gap.

(5)

The semiconductor device according to (4), in which the opening provided in the diffusion preventing layer is provided in a region that is not in contact with the wiring layer.

(6)

The semiconductor device according to any one of (1) to (5), in which the through-hole is provided to penetrate through a plurality of the insulating layers from one surface of the multilayered wiring layer.

(7)

The semiconductor device according to any one of (1) to (6), in which a surface of the wiring layer exposed by the gap is covered with a protective layer.

(8)

The semiconductor device according to any one of (1) to (7), in which the gap is provided in a region that includes a region immediately below the through-hole in a plan view from a laminating direction of the multilayered wiring layer.

(9)

The semiconductor device according to any one of (1) to (8), in which the gap causes the diffusion preventing layers laminated on an upper surface and a lower surface of the insulating layer provided with the gap to be exposed.

(10)

The semiconductor device according to any one of (1) to (9), in which the diffusion preventing layers and the protective side wall include materials with higher etching resistance with respect to a fluorine compound than the insulating layers.

(11)

An image pickup device including:

a multilayered wiring layer in which insulating layers and diffusion preventing layers are alternately laminated and a wiring layer is provided inside;

a through-hole that is provided to penetrate through at least one or more insulating layers from one surface of the multilayered wiring layer and has an inside covered with a protective side wall; and a gap that is provided in at least one or more insulating layers immediately below the through-hole.

(12)

The image pickup device according to (11), further including:

a pair of substrates that sandwich the multilayered wiring layer in a laminating direction, in which the through-hole is provided to further penetrate through one of the substrates.

(13)

The image pickup device according to (11) or (12), in which the multilayered wiring layer includes a color sensor inside, and the surface on the side on which the through-hole is provided is a surface on a side on which the color sensor is provided in the multilayered wiring layer.

(14)

A method for manufacturing a semiconductor device, including:

a step of forming a multilayered wiring layer in which insulating layers and diffusion preventing layers are alternately laminated and a wiring layer is provided inside;

a step of forming a through-hole such that the through-hole penetrates through at least one or more insulating layers from one surface of the multilayered wiring layer;

a step of forming a protective side wall inside the through-hole; and a step of forming a gap by etching at least one or more insulating layers immediately below the through-hole.

(15)

The method for manufacturing a semiconductor device according to (15), in which the gap is formed by performing wet etching on the insulating layer.

REFERENCE SIGNS LIST 1, 2 semiconductor device
100 insulating layer
110 first insulating layer
120 second insulating layer
130 third insulating layer
140 fourth insulating layer
150 fifth insulating layer
200 diffusion preventing layer
210 first diffusion preventing layer
220 second diffusion preventing layer
230 third diffusion preventing layer
240 fourth diffusion preventing layer
250 fifth diffusion preventing layer
300 wiring layer
310 first wiring layer
320 second wiring layer 330 third wiring layer
340 fourth wiring layer
400 through-via
410 first through-via
420 second through-via
430 third through-via.
510 through-hole
520 protective side wall
530 gap
540 protective layer
610 contact plug
600, 620 substrate

The invention claimed is:

1. A semiconductor device, comprising:
a multilayered wiring layer in which insulating layers and diffusion preventing layers are alternately laminated and a wiring layer is provided inside;
a through-hole that is provided to penetrate through at least one or more of the insulating layers from one surface of the multilayered wiring layer and has an inside covered with a protective side wall;
a gap that is provided in at least one or more of the insulating layers immediately below the through-hole,
wherein an entire first side of a first wire of the wiring layer is in contact with the gap in a cross sectional view,
wherein an entire second side of the first wire of the wiring layer is in contact with the gap in the cross sectional view, and
wherein an entire third side of the first wire of the wiring layer is in contact with the gap in the cross sectional view; and
a pair of substrates that sandwich the multilayered wiring layer in a laminating direction,
wherein the through-hole is provided to further penetrate through one of the substrates.

2. The semiconductor device according to claim 1, wherein at least a part of the wiring layer is provided inside the gap.

3. The semiconductor device according to claim 1, wherein the gap is provided over a plurality of the insulating layers.

4. The semiconductor device according to claim 3, wherein an opening is provided in a partial region in the diffusion preventing layer between the plurality of insulating layers provided with the gap.

5. The semiconductor device according to claim 4, wherein the opening provided in the diffusion preventing layer is provided in a region that is not in contact with the wiring layer.

6. The semiconductor device according to claim 1, wherein the through-hole is provided to penetrate through a plurality of the insulating layers from one surface of the multilayered wiring layer.

7. The semiconductor device according to claim 1, wherein a surface of the wiring layer exposed by the gap is covered with a protective layer.

8. The semiconductor device according to claim 1, wherein the gap is provided in a region that includes a region immediately below the through-hole in a plan view from a laminating direction of the multilayered wiring layer.

9. The semiconductor device according to claim 1, wherein the gap causes the diffusion preventing layers laminated on an upper surface and a lower surface of the at least one insulating layer provided with the gap to be exposed.

10. The semiconductor device according to claim 1, wherein the diffusion preventing layers and the protective side wall include materials with higher etching resistance with respect to a fluorine compound than the insulating layers.

11. An image pickup device, comprising:
a multilayered wiring layer in which insulating layers and diffusion preventing layers are alternately laminated and a wiring layer is provided inside;
a through-hole that is provided to penetrate through at least one or more of the insulating layers from one surface of the multilayered wiring layer and has an inside covered with a protective side wall;
a gap that is provided in at least one or more of the insulating layers immediately below the through-hole,
wherein an entire first side of a first wire of the wiring layer is in contact with the gap in a cross sectional view,
wherein an entire second side of the first wire of the wiring layer is in contact with the gap in the cross sectional view, and
wherein an entire third side of the first wire of the wiring layer is in contact with the gap in the cross sectional view; and
a pair of substrates that sandwich the multilayered wiring layer in a laminating direction,
wherein the through-hole is provided to further penetrate through one of the substrates.

12. The image pickup device according to claim 11,
wherein the multilayered wiring layer includes a color sensor inside, and
the surface on the side on which the through-hole is provided is a surface on a side on which the color sensor is provided in the multilayered wiring layer.

13. A method for manufacturing a semiconductor device, comprising:
a step of forming a multilayered wiring layer in which insulating layers and diffusion preventing layers are alternately laminated and a wiring layer is provided inside;
a step of forming a through-hole such that the through-hole penetrates through at least one or more of the insulating layers from one surface of the multilayered wiring layer;
a step of forming a protective side wall inside the through-hole;
a step of forming a gap by etching at least one or more of the insulating layers immediately below the through-hole,
wherein an entire first side of a first wire of the wiring layer is in contact with the gap in a cross sectional view,
wherein an entire second side of the first wire of the wiring layer is in contact with the gap in the cross sectional view, and
wherein an entire third side of the first wire of the wiring layer is in contact with the gap in the cross sectional view; and
a step of forming a pair of substrates that sandwich the multilayered wiring layer in a laminating direction,
wherein the through-hole is provided to further penetrate through one of the substrates.

14. The method for manufacturing a semiconductor device according to claim 13, wherein the gap is formed by performing wet etching on the insulating layer.

15. A semiconductor device, comprising:
a multilayered wiring layer in which insulating layers and diffusion preventing layers are alternately laminated and a wiring layer is provided inside;
a through-hole that is provided to penetrate through at least one or more of the insulating layers from one surface of the multilayered wiring layer and has an inside covered with a protective side wall; and a gap that is provided in at least one or more of the insulating layers immediately below the through-hole, wherein an entire first side of a first wire of the wiring layer is in contact with the gap in a cross sectional view, wherein an entire second side of the first wire of the wiring layer is in contact with the gap in the cross sectional view, wherein an entire third side of the first wire of the wiring layer is in contact with the gap in the cross sectional view, wherein the multilayered wiring layer includes a color sensor inside, and the surface on the side on which the through-hole is provided is a surface on a side on which the color sensor is provided in the multilayered wiring layer.

16. The semiconductor device according to claim 15, wherein a surface of the wiring layer exposed by the gap is covered with a protective layer.

17. The semiconductor device according to claim 15, wherein the gap is provided in a region that includes a region immediately below the through-hole in a plan view from a laminating direction of the multilayered wiring layer.

18. The semiconductor device according to claim 15, wherein the gap causes the diffusion preventing layers laminated on an upper surface and a lower surface of the at least one insulating layer provided with the gap to be exposed.

19. The semiconductor device according to claim 15, wherein the diffusion preventing layers and the protective side wall include materials with higher etching resistance with respect to a fluorine compound than the insulating layers.

20. The semiconductor device according to claim 15, wherein the through-hole is provided to penetrate through a plurality of the insulating layers from one surface of the multilayered wiring layer.

* * * * *